(12) United States Patent
Huang et al.

(10) Patent No.: US 12,068,248 B2
(45) Date of Patent: Aug. 20, 2024

(54) SEMICONDUCTOR INTERCONNECTION STRUCTURE AND METHODS OF FORMING THE SAME

(71) Applicant: TAIWAN SEMICONDUCTOR MANUFACTURING COMPANY, LTD., Hsinchu (TW)

(72) Inventors: Hsin-Yen Huang, New Taipei (TW);
Ting-Ya Lo, Hsinchu (TW);
Shao-Kuan Lee, Kaohsiung (TW);
Chi-Lin Teng, Taichung (TW);
Cheng-Chin Lee, Taipei (TW);
Hsiaokang Chang, Hsinchu (TW);
Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 459 days.

(21) Appl. No.: 17/217,694

(22) Filed: Mar. 30, 2021

(65) Prior Publication Data
US 2022/0319990 A1 Oct. 6, 2022

(51) Int. Cl.
*H01L 21/768* (2006.01)
*H01L 23/522* (2006.01)
*H01L 23/528* (2006.01)

(52) U.S. Cl.
CPC .... *H01L 23/5283* (2013.01); *H01L 21/76802* (2013.01); *H01L 21/7682* (2013.01); *H01L 21/76831* (2013.01); *H01L 21/76843* (2013.01); *H01L 23/5226* (2013.01)

(58) Field of Classification Search
CPC ............. H01L 21/7682; H01L 21/5283; H01L 21/76837; H01L 21/76831; H01L 23/5283; H01L 23/5226; H01L 23/5222
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 * | 1/2017 | Ho | H01L 21/823475 |
| 9,576,814 B2 | 2/2017 | Wu et al. | |

(Continued)

*Primary Examiner* — Walter H Swanson
*Assistant Examiner* — Jacob T Nelson
(74) *Attorney, Agent, or Firm* — NZ CARR LAW OFFICE

(57) ABSTRACT

An interconnect structure includes a dielectric layer, a conductive feature, a conductive layer, a capping layer, a support layer and an etch stop layer. The conductive feature is disposed in the dielectric layer. A first portion of the conductive layer is disposed over the first conductive feature, and a second portion of the conductive layer is disposed over the dielectric layer. A first portion of the capping layer is in contact with the first portion of the conductive layer, a second portion of the capping layer is in contact with the second portion of the conductive layer, and a third portion of the capping layer is in contact with the dielectric layer. An air gap is defined by the support layer and the capping layer. The etch stop layer is disposed over the second portion of the conductive layer, the second portion of the capping layer and the support layer.

20 Claims, 22 Drawing Sheets

(56) References Cited

U.S. PATENT DOCUMENTS

| | | |
|---|---|---|
| 9,831,183 B2 | 11/2017 | Lin et al. |
| 9,859,386 B2 | 1/2018 | Ho et al. |
| 2016/0093566 A1* | 3/2016 | Ting .................. H01L 21/76808 438/643 |
| 2020/0258772 A1* | 8/2020 | Hsieh .................. H01L 23/5222 |
| 2021/0193566 A1* | 6/2021 | Lo ....................... H01L 21/7682 |

* cited by examiner

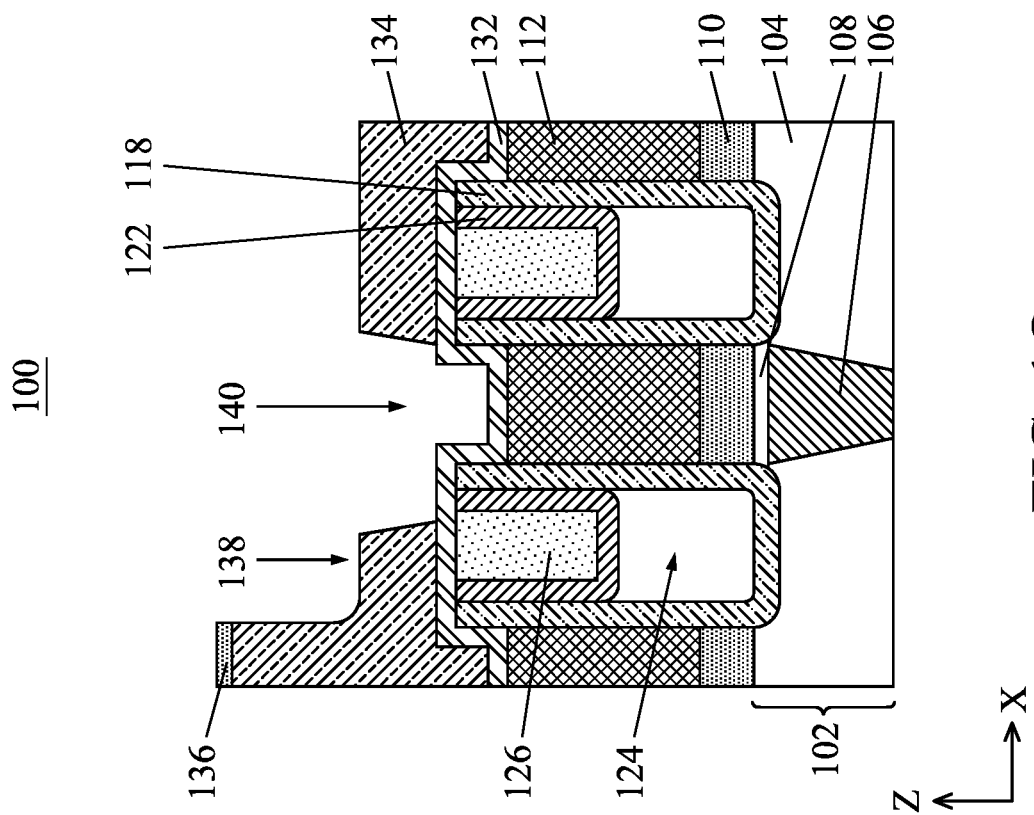
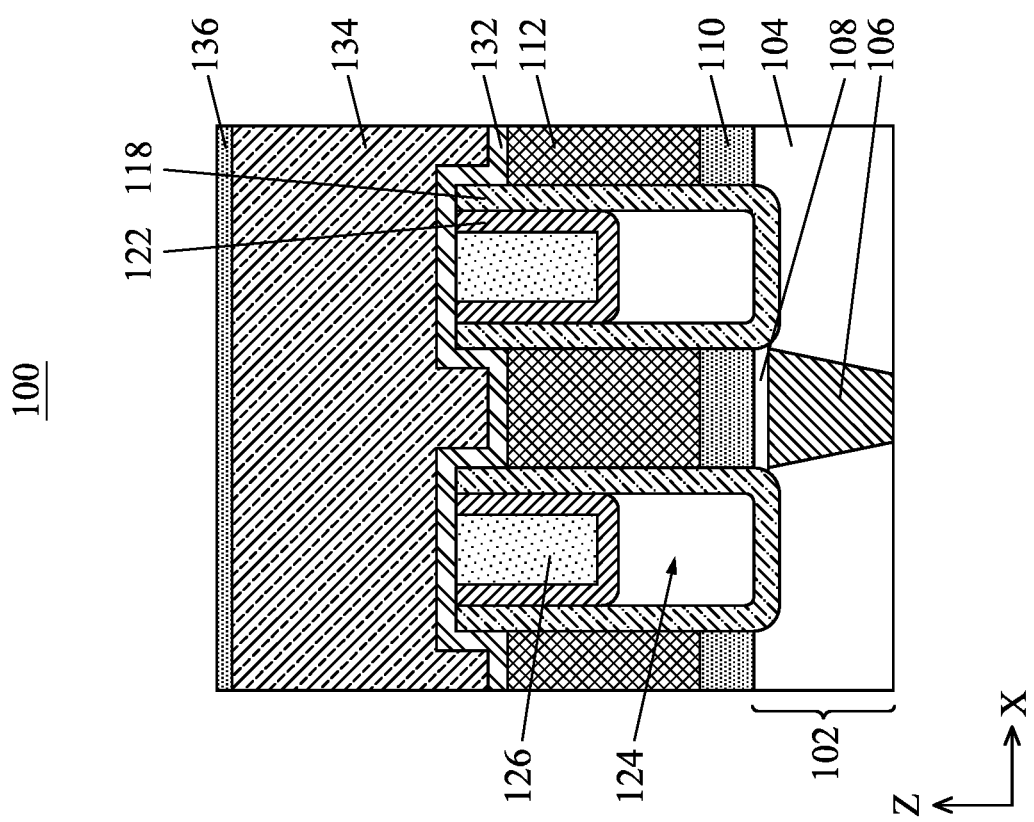
FIG. 1P
FIG. 1Q

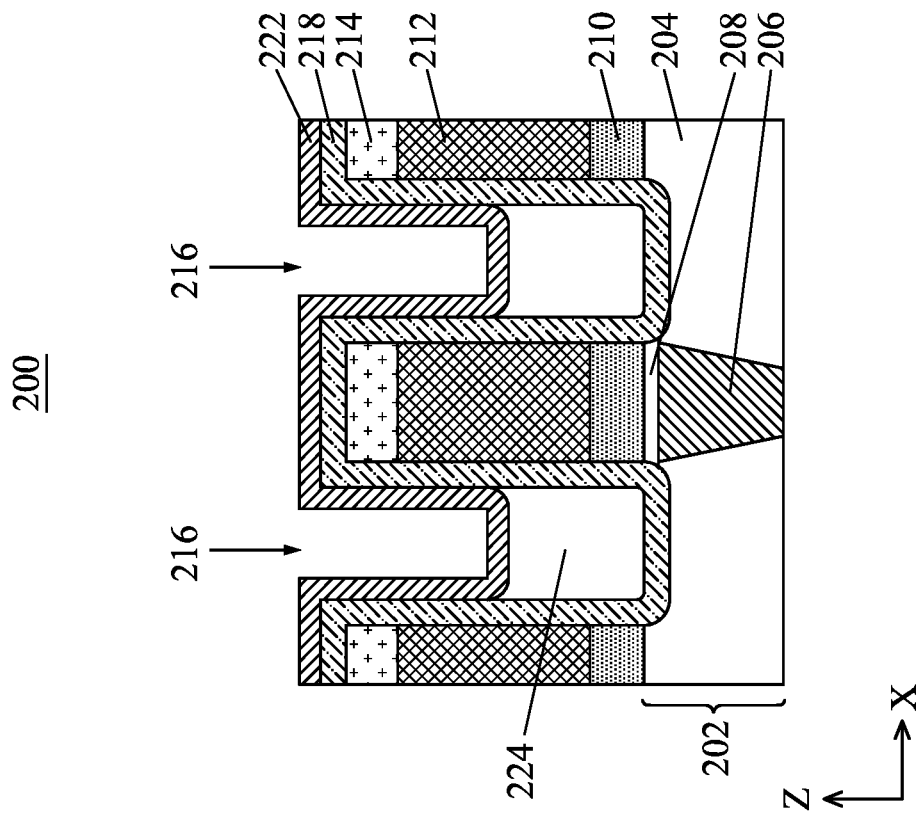
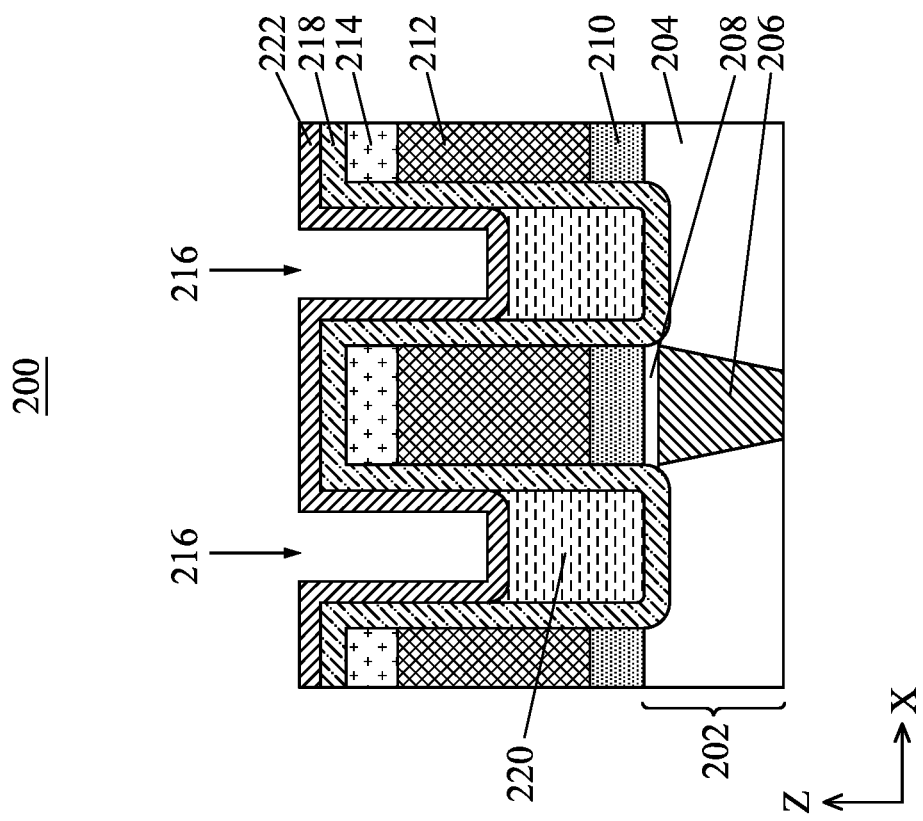
FIG. 2G
FIG. 2H

US 12,068,248 B2

SEMICONDUCTOR INTERCONNECTION STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, for any two adjacent conductive features, as the distance between the conductive features decreases, the resulting capacitance (a function of the dielectric constant (k value) of the insulating material divided by the distance between the conductive features) increases. This increased capacitance results in increased capacitive coupling between the conductive features, increased power consumption, and an increase in the resistive-capacitive (RC) time constant.

Therefore, there is a need in the art to provide an improved device that can address the issues mentioned above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
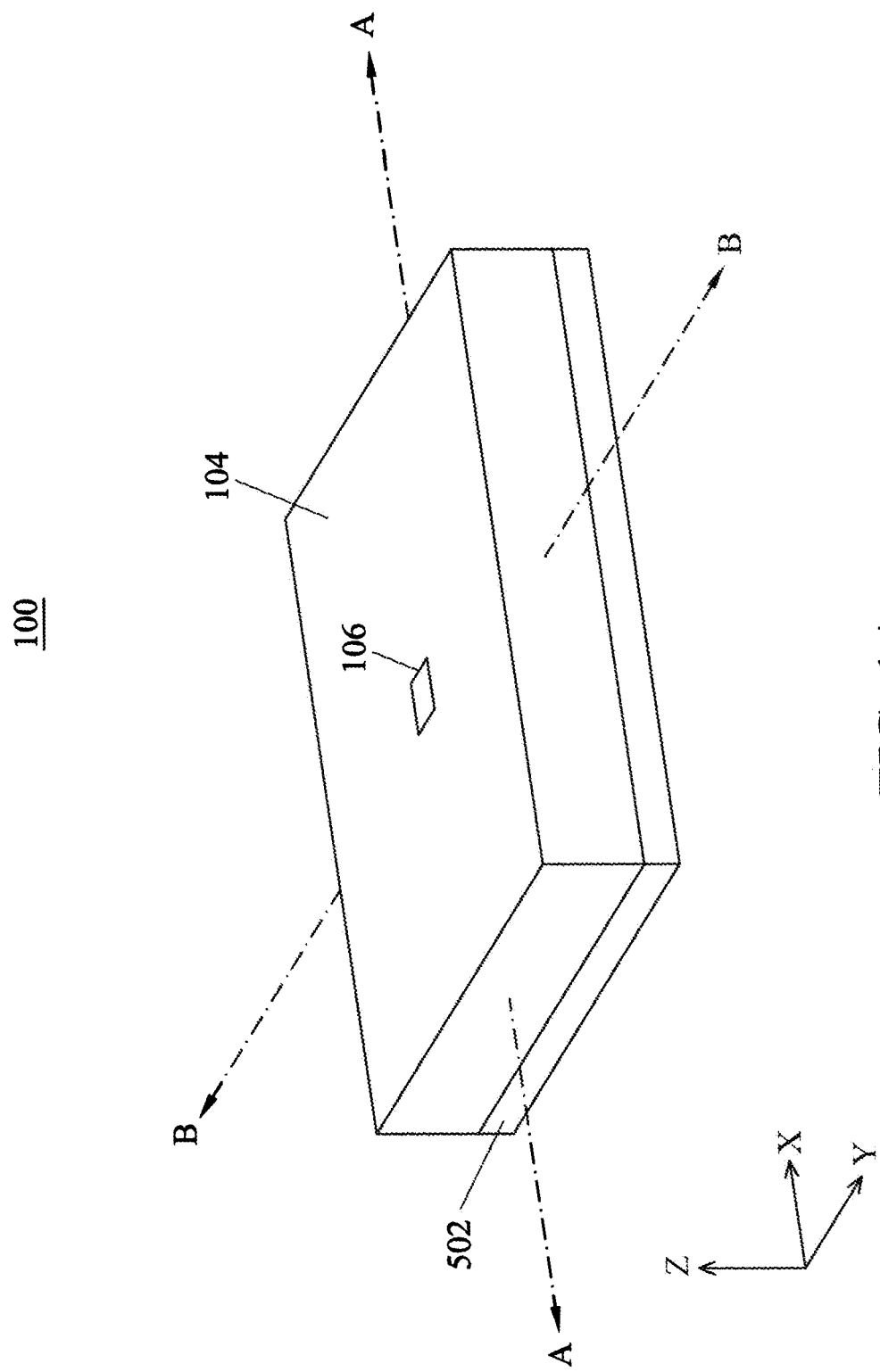
FIG. 1A is a perspective view of one of the various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1C:
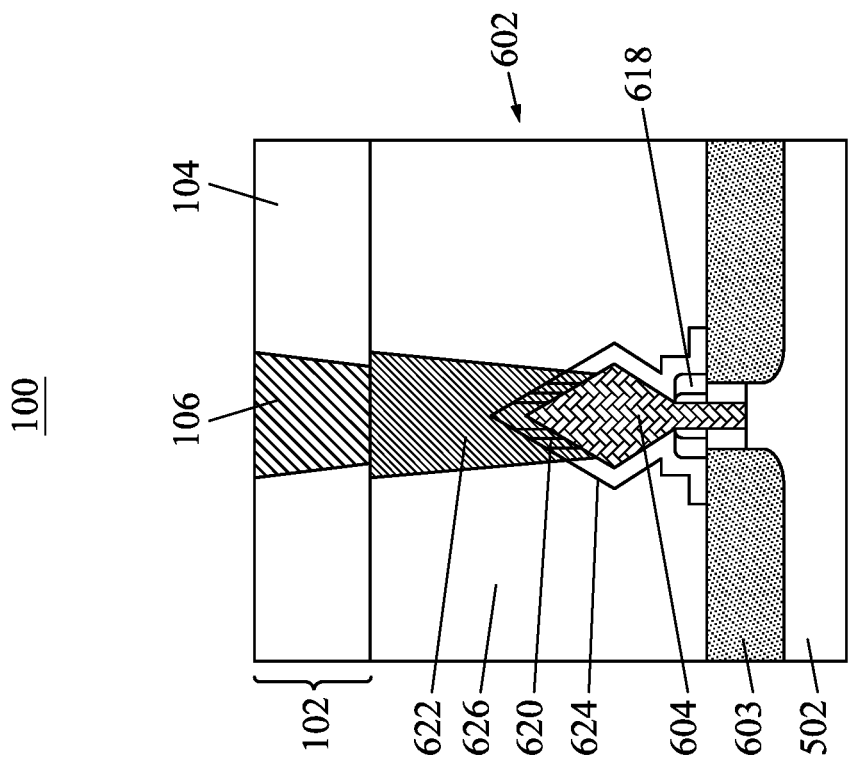
FIGS. 1B-1T are cross-sectional side views of various stages of manufacturing an interconnect structure, in accordance with some embodiments.
Figure 1B:
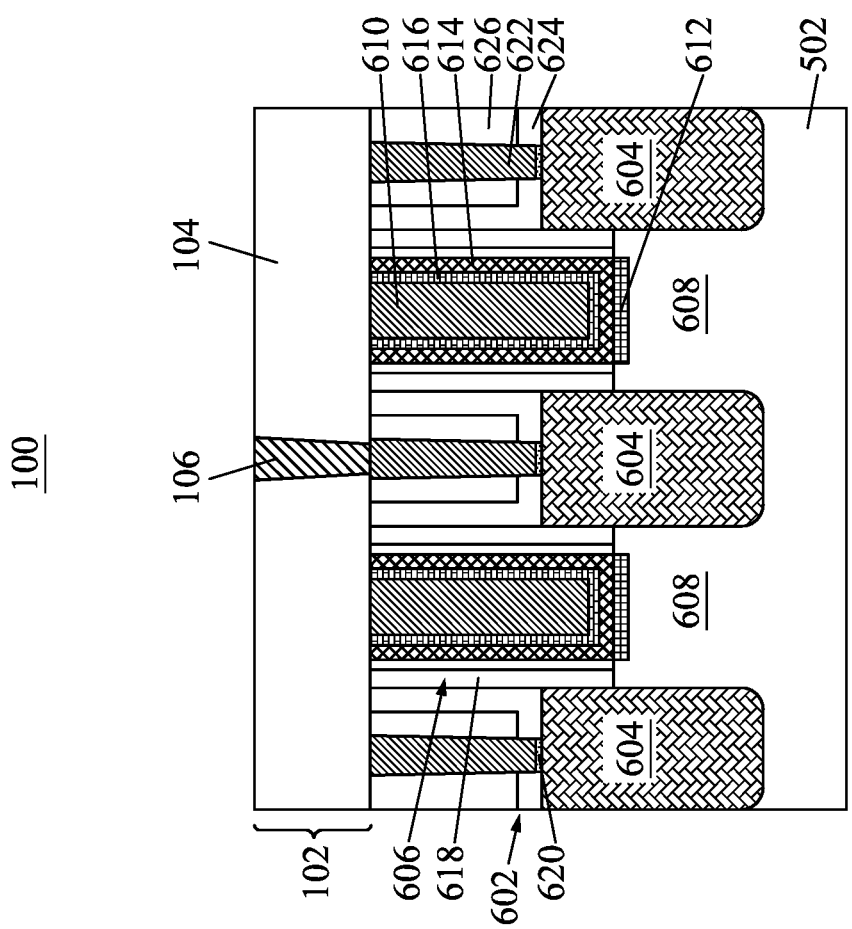
Figure 1E:
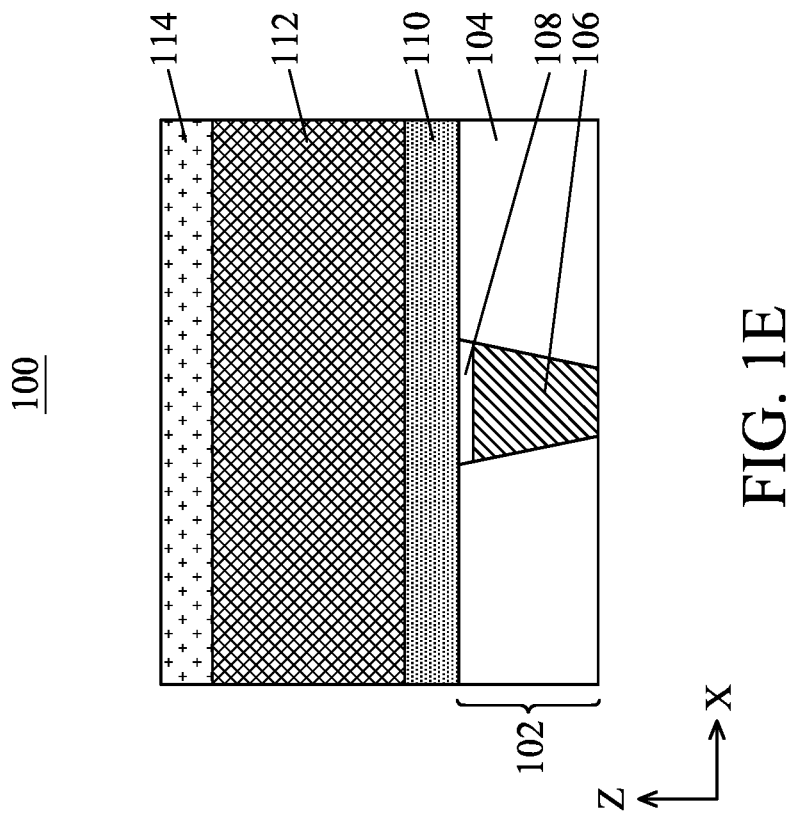
Figure 1D:
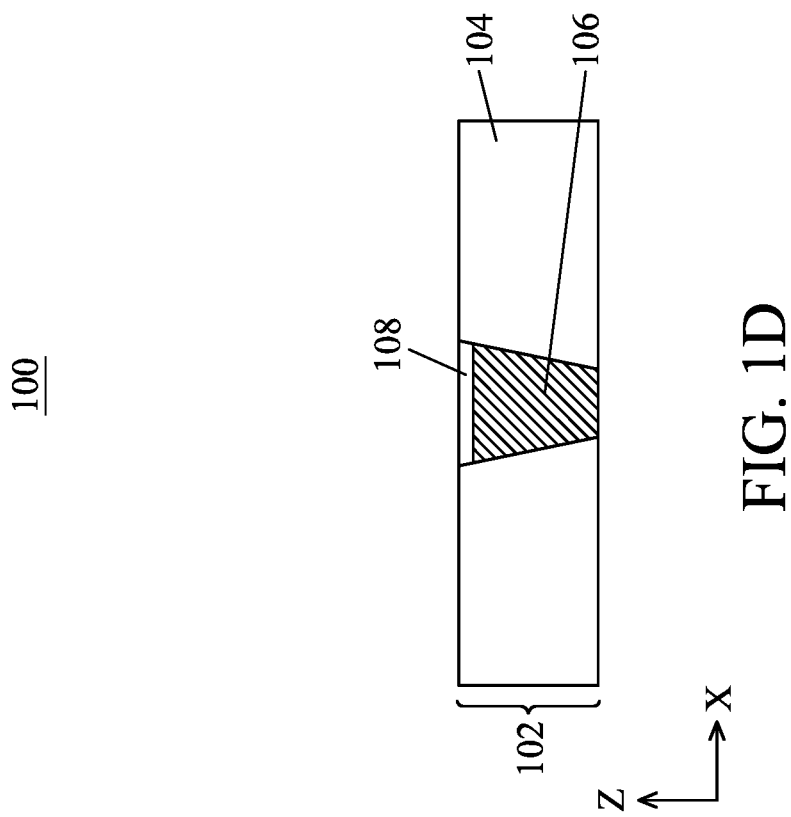
Figure 1F:
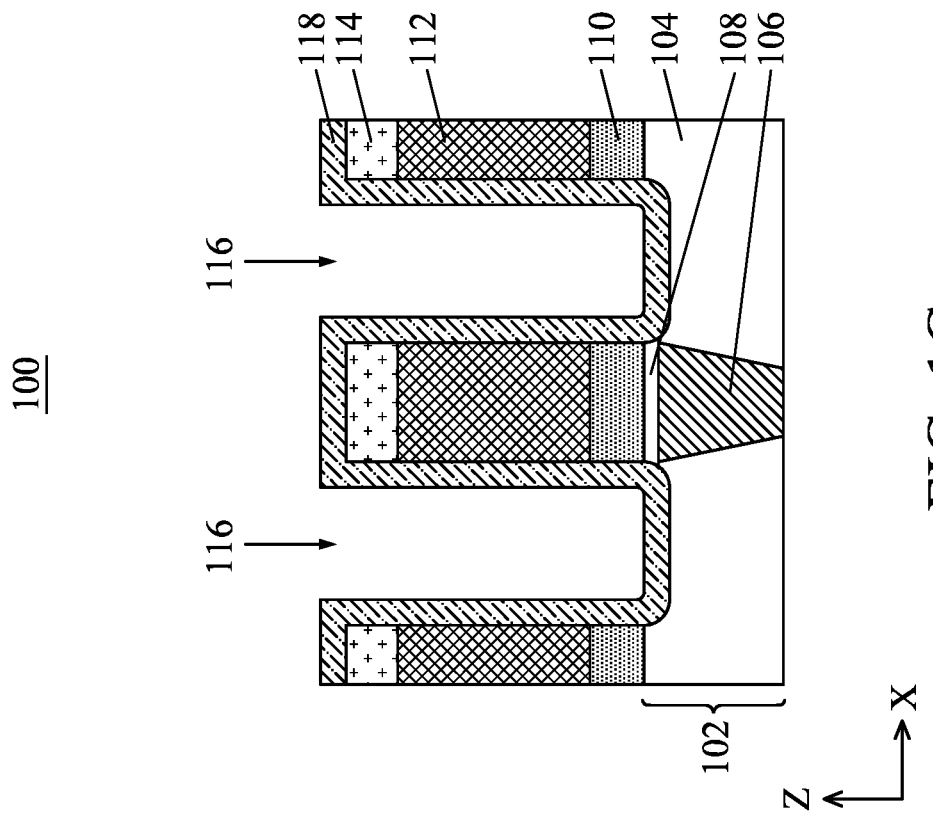
Figure 1G:
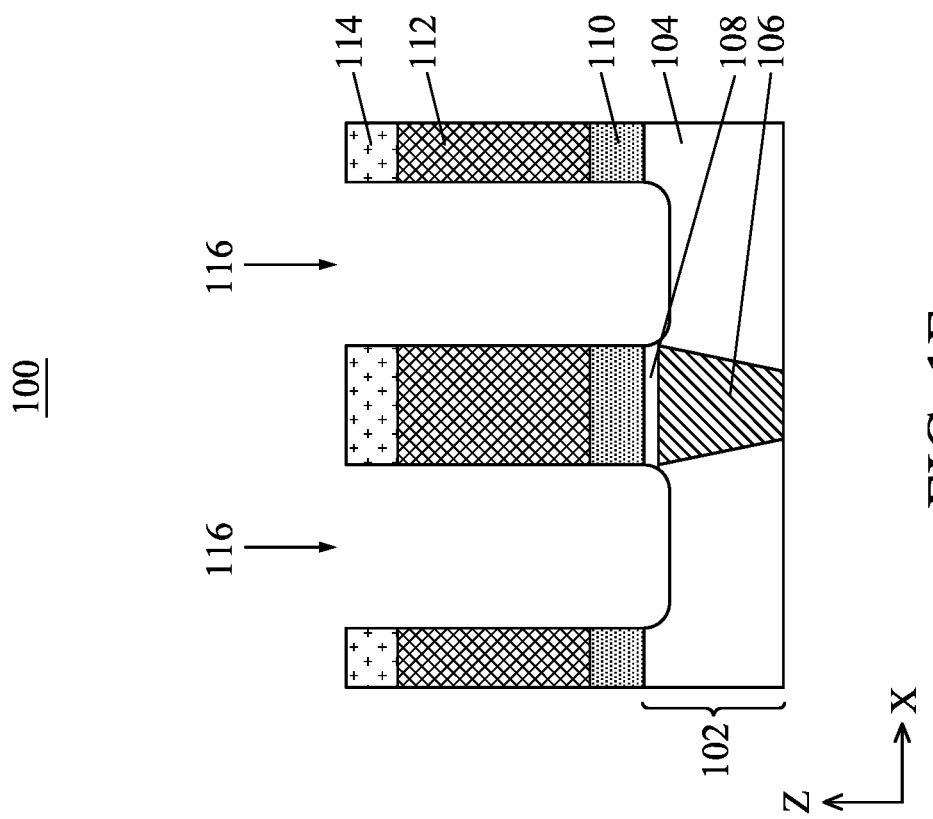
Figure 1I:
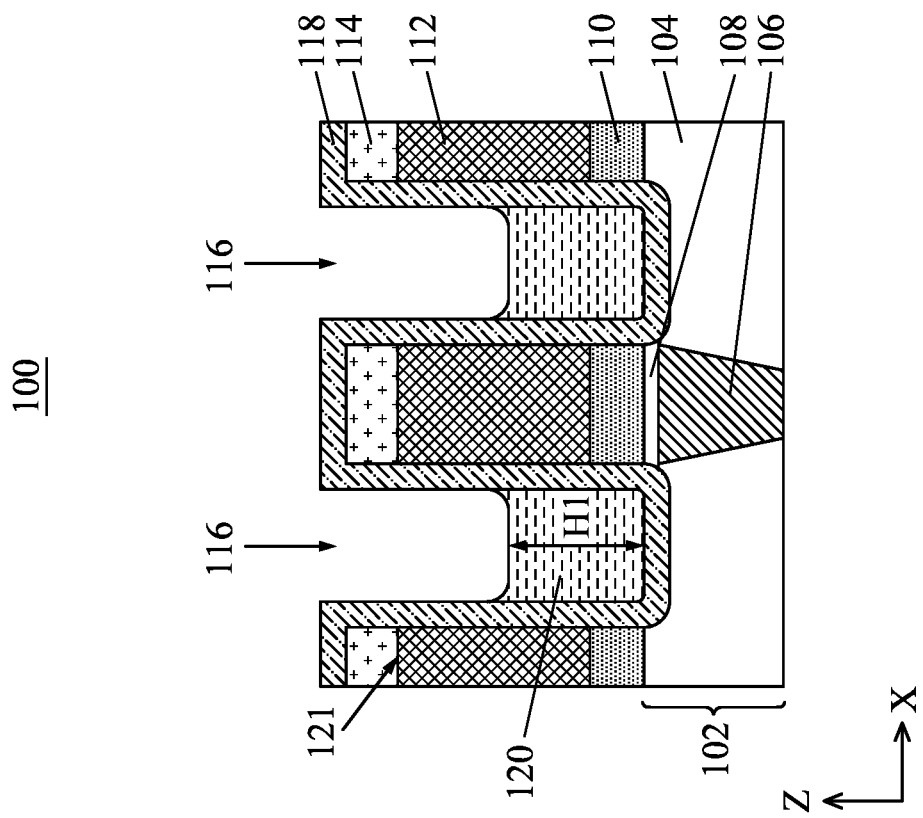
Figure 1H:
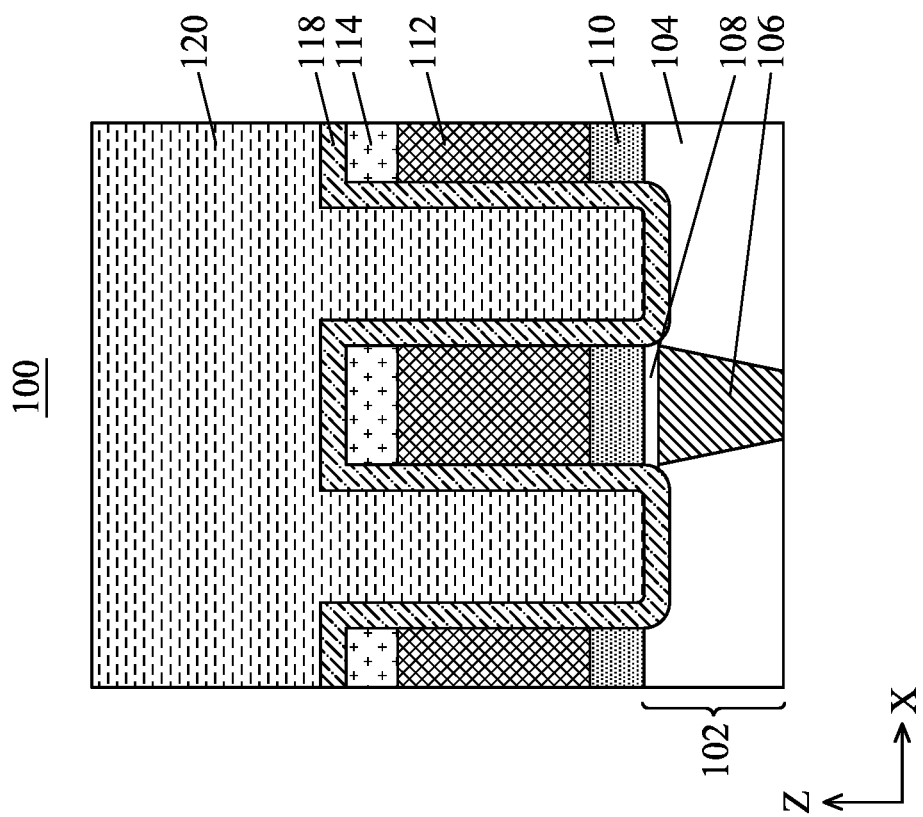
Figure 1K:
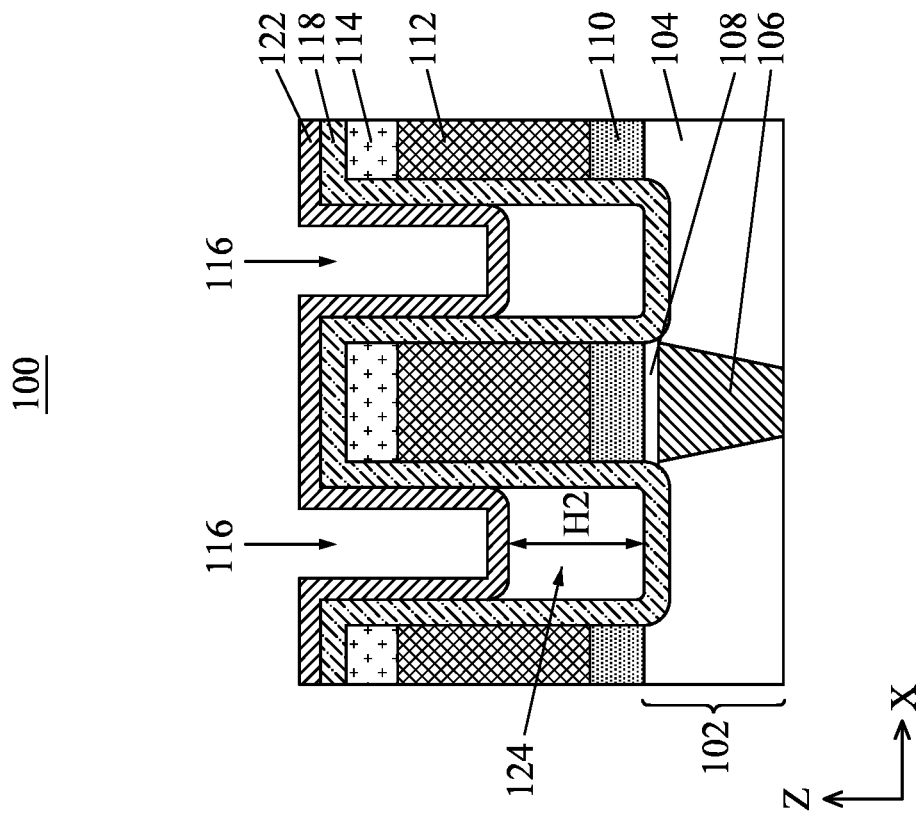
Figure 1J:
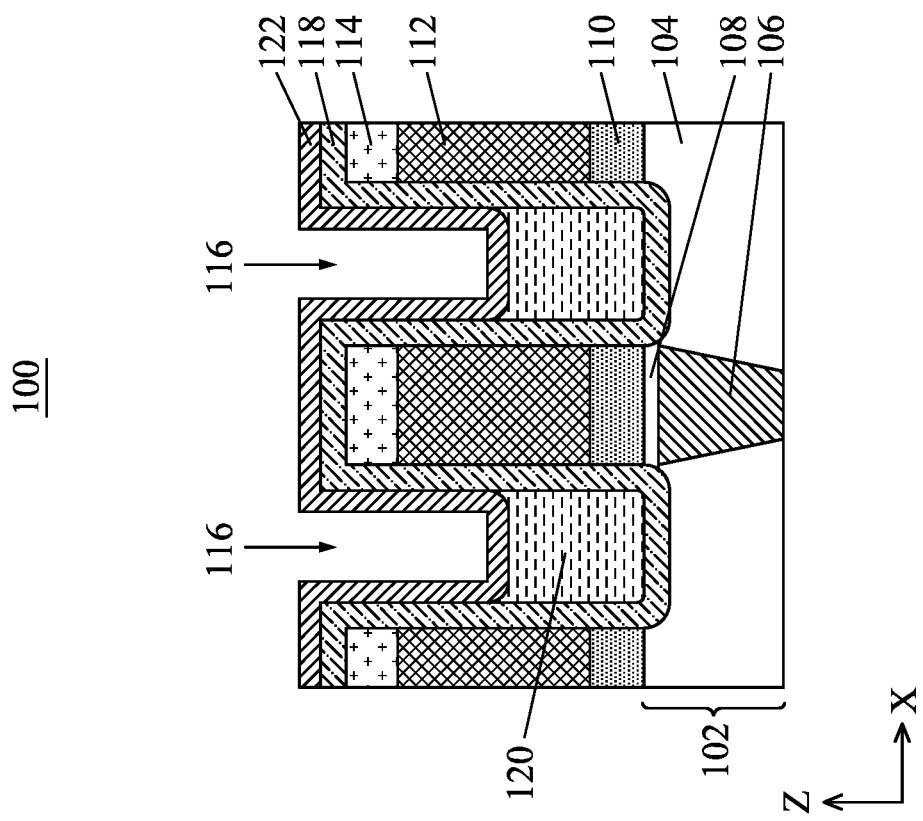
Figure 1L:
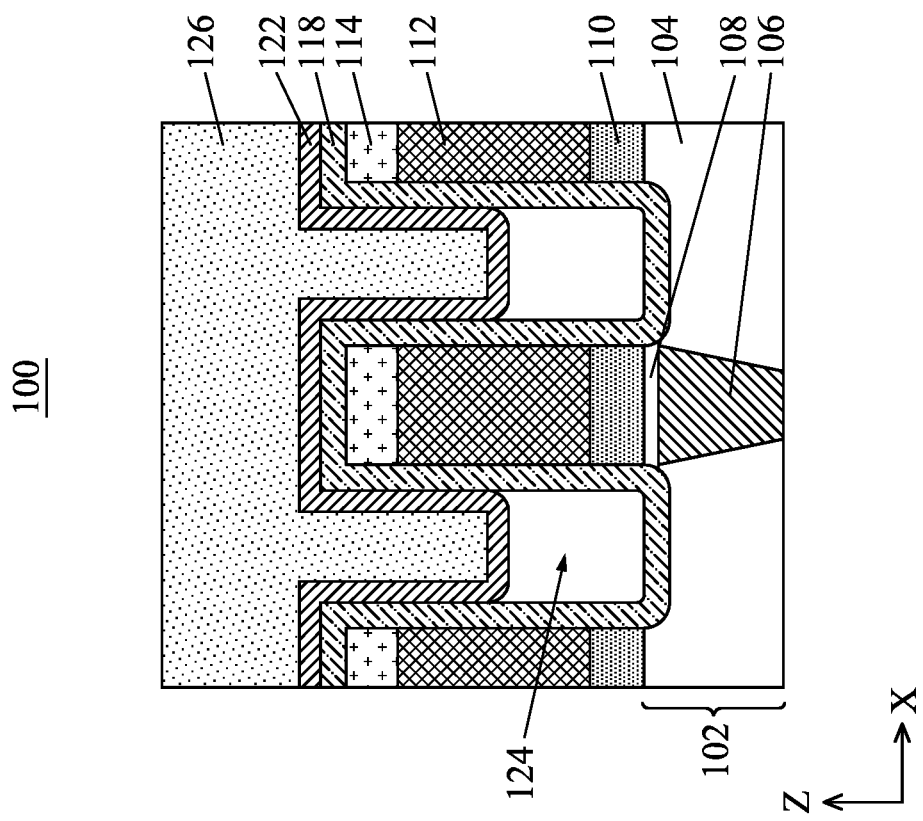
Figure 1M:
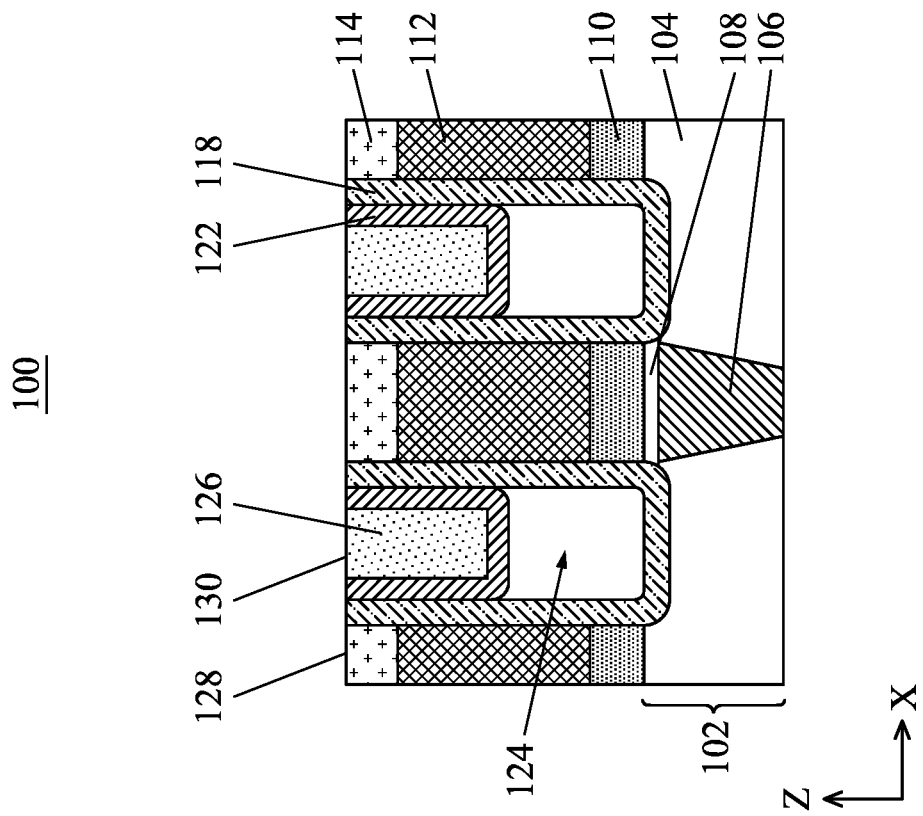
Figure 1N:
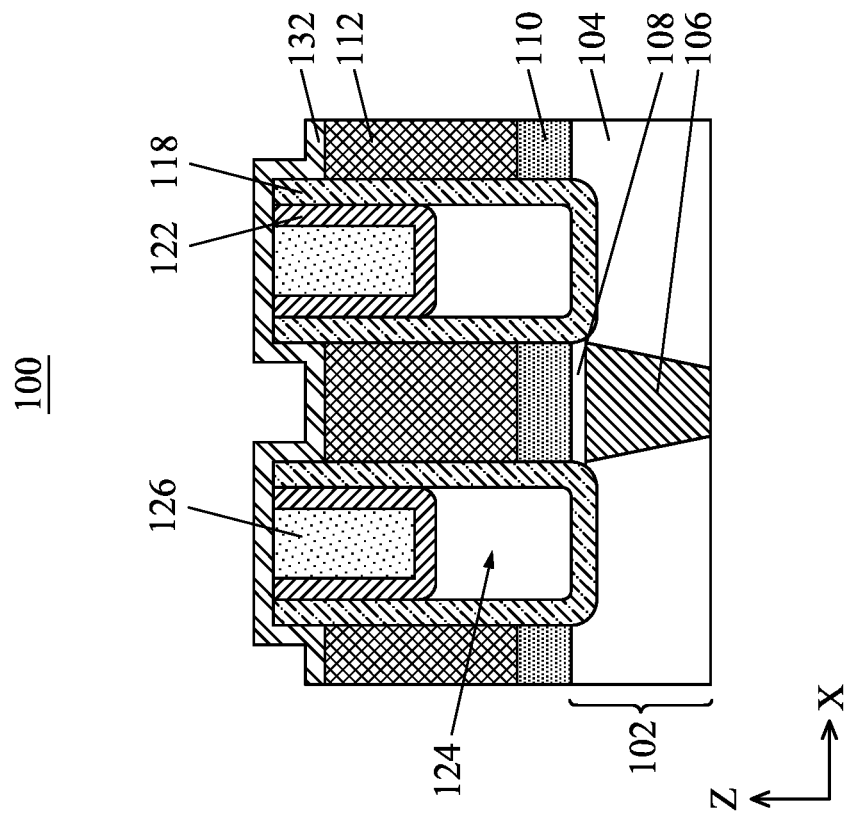
Figure 1O:
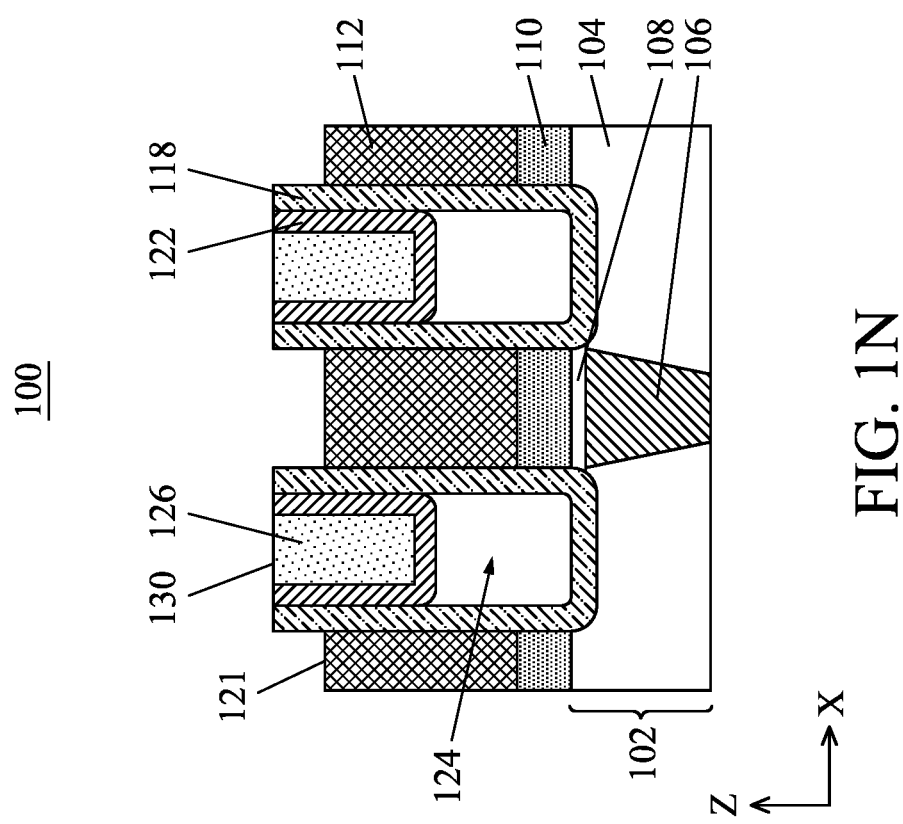
Figure 1R:
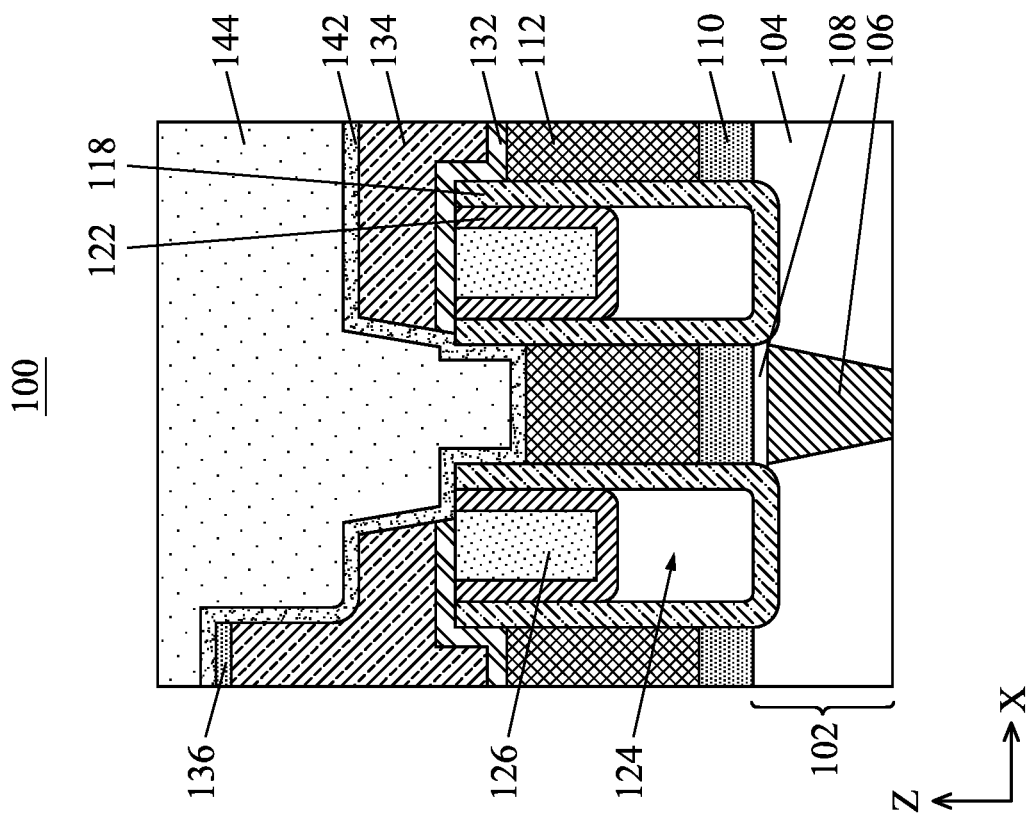
Figure 1S:
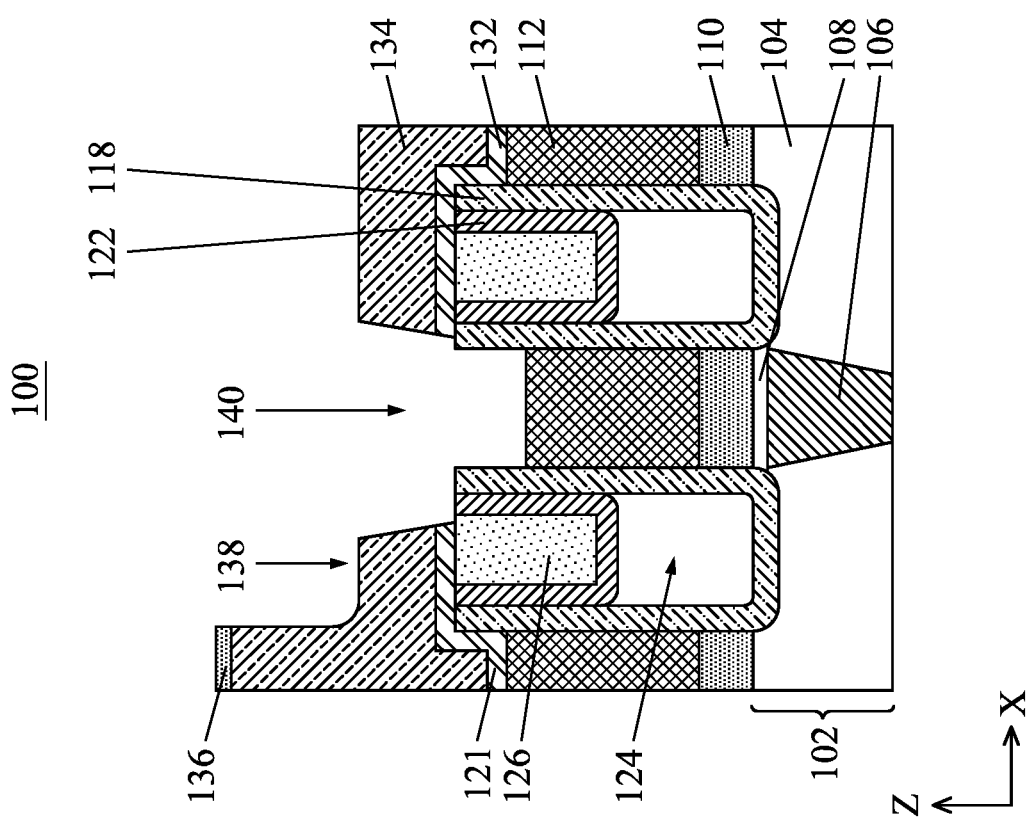
Figure 1T:
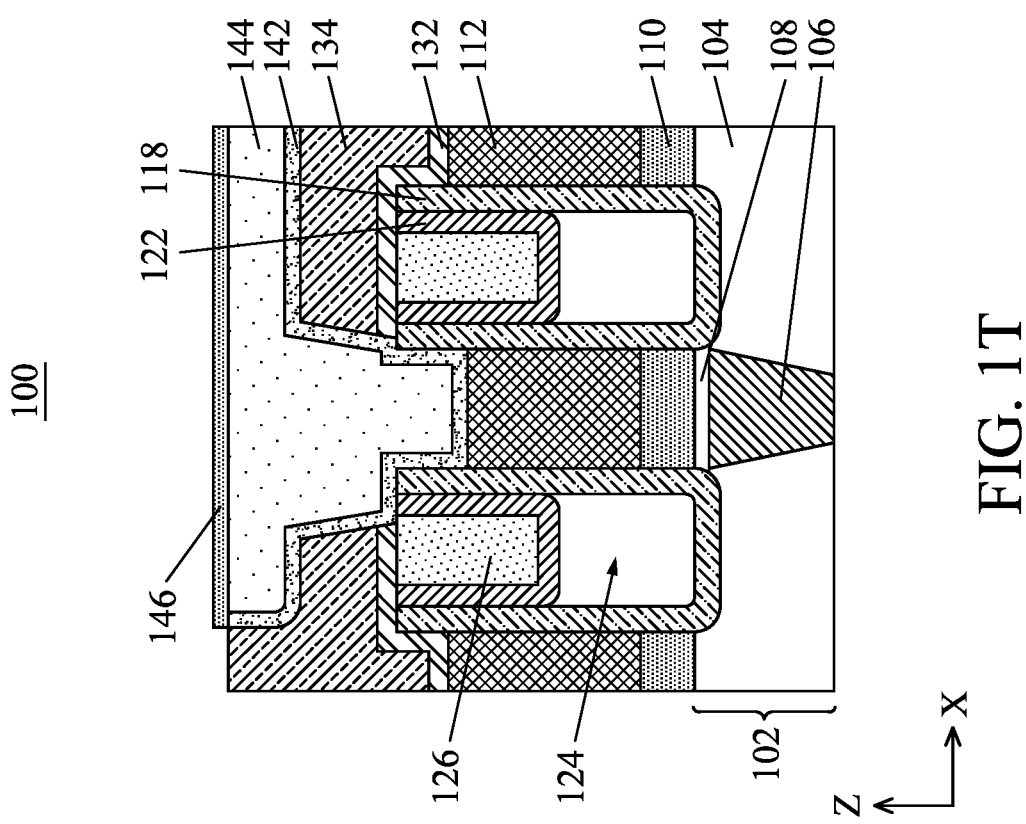

FIGS. 1A-1T show exemplary sequential processes for manufacturing a semiconductor device structure 100, in accordance with some embodiments. It is understood that additional operations can be provided before, during, and after processes shown by FIGS. 1A-1T, and some of the operations described below can be replaced or eliminated, for additional embodiments of the process. The order of the operations/processes may be interchangeable.

FIG. 1A is a perspective view of one of the various stages of manufacturing a semiconductor device structure 100, in accordance with some embodiments. As shown in FIG. 1A, the semiconductor device structure 100 includes a substrate 502 having at least a plurality of conductive features formed thereover (one conductive feature 106 is shown in FIG. 1A). The conductive feature 106 is formed in a dielectric material 104. One or more devices (not shown), such as transistors, diodes, imaging sensors, resistors, capacitors, inductors, memory cells, a combination thereof, and/or other suitable devices, may be formed between the substrate 502 and the conductive feature 106.

FIG. 1B is a cross-sectional side view of the semiconductor device structure 100 taken along line A-A of FIG. 1A, and FIG. 1C is a cross-sectional side view of the semiconductor device structure 100 taken along line B-B of FIG. 1A. The line A-A of FIG. 1A extends along a direction that is substantially perpendicular to the longitudinal direction of a gate stack 606, and the line B-B of FIG. 1A extends along the longitudinal direction of the gate stack 506. As shown in FIGS. 1B and 1C, the semiconductor device structure 100 includes the substrate 502, one or more devices 602 formed on the substrate 502, the dielectric material 104 formed over the devices 602, and the conductive features 106 formed in the dielectric material 104. The substrate 502 may be a semiconductor substrate. In some embodiments, the substrate 502 includes a single crystalline semiconductor layer on at least the surface of the substrate 502. The substrate 502 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 502 is made of Si. In some embodiments, the substrate 502 is a silicon-on-insulator (SOI) substrate, which includes an insulating layer (not shown) disposed between two silicon layers. In one aspect, the insulating layer is an oxygen-containing material, such as an oxide.

The substrate 502 may include one or more buffer layers (not shown) on the surface of the substrate 502. The buffer layers can serve to gradually change the lattice constant from that of the substrate to that of the source/drain regions. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 502 includes SiGe buffer layers epitaxially grown on the silicon substrate 502. The germanium concentration of the SiGe buffer layers may increase from 30 atomic percent germanium for the bottom-most buffer layer to 70 atomic percent germanium for the top-most buffer layer.

The substrate 502 may include various regions that have been suitably doped with impurities (e.g., p-type or n-type impurities). The dopants are, for example boron for an n-type fin field effect transistor (FinFET) and phosphorus for a p-type FinFET.

As described above, the devices 602 may be any suitable devices, such as transistors, diodes, imaging sensors, resistors, capacitors, inductors, memory cells, or a combination thereof. In some embodiments, the devices 602 are transistors, such as planar field effect transistors (FETs), FinFETs, nanosheet transistors, or other suitable transistors. The nanosheet transistors may include nanowire transistors, gate-all-around (GAA) transistors, multi-bridge channel (MBC) transistors, or any transistors having the gate electrode surrounding the channels. An example of the device 602 formed between the substrate 502 and the conductive features 106 is a FinFET, which is shown in FIGS. 1B and 1C. The device 602 includes source/drain (S/D) regions 604 and gate stacks 606. Each gate stack 606 may be disposed between S/D regions 604 serving as source regions and S/D regions 604 serving as drain regions. For example, each gate stack 606 may extend along the Y-axis between a plurality of S/D regions 604 serving as source regions and a plurality of S/D regions 604 serving as drain regions. As shown in FIG. 1B, two gate stacks 606 are formed on the substrate 502. In some embodiments, more than two gate stacks 606 are formed on the substrate 502. Channel regions 608 are formed between S/D regions 604 serving as source regions and S/D regions 604 serving as drain regions.

The S/D regions 604 may include a semiconductor material, such as Si or Ge, a III-V compound semiconductor, a II-VI compound semiconductor, or other suitable semiconductor material. Exemplary S/D region 604 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 604 may include p-type dopants, such as boron; n-type dopants, such as phosphorus or arsenic; and/or other suitable dopants including combinations thereof. The S/D regions 604 may be formed by an epitaxial growth method using CVD, atomic layer deposition (ALD) or molecular beam epitaxy (MBE). The channel regions 608 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 608 include the same semiconductor material as the substrate 502. In some embodiments, the devices 602 are FinFETs, and the channel regions 608 are a plurality of fins disposed below the gate stacks 606. In some embodiments, the devices 602 are nanosheet transistors, and the channel regions 608 are surrounded by the gate stacks 606.

Each gate stack 606 includes a gate electrode layer 610 disposed over the channel region 608 (or surrounding the channel region 608 for nanosheet transistors). The gate electrode layer 610 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 606 may include an interfacial dielectric layer 612, a gate dielectric layer 614 disposed on the interfacial dielectric layer 612, and one or more conformal layers 616 disposed on the gate dielectric layer 614. The gate electrode layer 610 may be disposed on the one or more conformal layers 616. The interfacial dielectric layer 612 may include a dielectric material, such as an oxygen-containing material or a nitrogen-containing material, or multilayers thereof, and may be formed by any suitable deposition method, such as CVD, PECVD, or ALD. The gate dielectric layer 614 may include a dielectric material such as an oxygen-containing material or a nitrogen-containing material, a high-k dielectric material having a k value greater than about 7.0, or multilayers thereof. The gate dielectric layer 614 may be formed by any suitable method, such as CVD, PECVD, or ALD. The one or more conformal layers 616 may include one or more barrier layers and/or capping layers, such as a nitrogen-containing material, for example tantalum nitride (TaN), titanium nitride (TiN), or the like. The one or more conformal layers 616 may further include one or more work-function layers, such as aluminum titanium carbide, aluminum titanium oxide, aluminum titanium nitride, or the like. The term "conformal" may be used herein for ease of description upon a layer having substantial same thickness over various regions. The one or more conformal layers 616 may be deposited by ALD, PECVD, MBD, or any suitable deposition technique.

Gate spacers 618 are formed along sidewalls of the gate stacks 606 (e.g., sidewalls of the gate dielectric layers 614). The gate spacers 618 may include silicon oxycarbide, silicon nitride, silicon oxynitride, silicon carbon nitride, the like, multi-layers thereof, or a combination thereof, and may be deposited by CVD, ALD, or other suitable deposition technique.

Portions of the gate stacks 606 and the gate spacers 618 may be formed on isolation regions 603. The isolation regions 603 are formed on the substrate 502. The isolation regions 603 may include an insulating material such as an oxygen-containing material, a nitrogen-containing material, or a combination thereof. The insulating material may be formed by a high-density plasma chemical vapor deposition (HDP-CVD), a flowable chemical vapor deposition (FCVD), or other suitable deposition process. In one aspect, the isolation regions 603 includes silicon oxide that is formed by a FCVD process.

A contact etch stop layer (CESL) 624 is formed on a portion of the S/D regions 604 and the isolation region 603, and a first interlayer dielectric (ILD) 626 is formed on the CESL 624. The CESL 624 can provide a mechanism to stop an etch process when forming openings in the first ILD 626. The CESL 624 may be conformally deposited on surfaces of the S/D regions 604 and the isolation regions 603. The CESL 624 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The first ILD 626 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than silicon dioxide), and may be deposited by spin-on, CVD, FCVD, PECVD, PVD, or any suitable deposition technique.

A silicide layer 620 is formed on at least a portion of each S/D region 604, as shown in FIGS. 1B and 1C. The silicide layer 620 may include a material having one or more of WSi, CoSi, NiSi, TiSi, MoSi and TaSi. In some embodiments, the silicide layer 620 includes a metal or metal alloy silicide, and the metal includes a noble metal, a refractory metal, a rare earth metal, alloys thereof, or combinations thereof. A conductive contact 622 is disposed on each silicide layer 620. The conductive contact 622 may include a material having one or more of Ru, Mo, Co, Ni. W, Ti, Ta, Cu, Al, TiN or TaN, and the conductive contact 622 may be formed by any suitable method, such as electro-chemical plating (ECP), or PVD. The silicide layer 620 and the conductive contact 622 may be formed by first forming an opening in the first ILD 626 and the CESL 624 to expose at least a portion of the S/D region 604, then forming the silicide layer 620 on the exposed portion of the S/D region 604, and then forming the conductive contact 622 on the silicide layer 620.

The dielectric material 104 may be formed over the devices 602, as shown in FIGS. 1B and 1C. The dielectric material 104 may include an etch stop layer. The conductive features 106 are formed in the dielectric material 104, and each conductive feature 106 may be in contact with a corresponding conductive contact 622.

FIGS. 1DA-1T are cross-sectional side views of various stages of manufacturing the interconnect structure 100 along line A-A of FIG. 1A, in accordance with some embodiments. The interconnect structure 100 may be formed on various devices of a semiconductor structure. For example, the interconnect structure 100 may be formed on one or more devices, such as transistors, diodes, imaging sensors, resistors, capacitors, inductors, memory cells, combinations thereof, and/or other suitable devices. In some embodiments, the interconnect structure 100 may be formed on the transistors, such as nanostructure FET having a plurality of channels wrapped around by a gate electrode layer.

As shown in FIG. 1D, the interconnection structure 100 includes a layer 102, which may be an ILD layer or an intermetal dielectric (IMD) layer. The layer 102 includes a dielectric layer 104, one or more conductive features 106 (only one is shown) disposed in the dielectric layer 104, and an optional cap layer 108 disposed on each conductive feature 106. The dielectric layer 104 may include an insulating material made of an oxygen-containing material, such as silicon oxide or fluorine-doped silicate glass (FSG); a nitrogen-containing material, such as silicon nitride, silicon oxynitride (SiON), SiOCN, SiCN; a low-k dielectric material (e.g., a material having a k value lower than that of silicon oxide); or any suitable dielectric material. In some embodiments, the dielectric layer 104 includes silicon oxide. The dielectric layer 104 may be formed by chemical vapor deposition (CVD), atomic layer deposition (ALD), spin coating, or other suitable process. The conductive feature 106 and the cap layer 108 may each include an electrically conductive material, such as Cu, Co, Ru, Mo, Cr, W, Mn, Rh, Ir, Ni, Pd, Pt, Ag, Au, Al, alloys thereof, or other suitable material. In some embodiments, the conductive feature 106 and the cap layer 108 each includes a metal. The conductive feature 106 may be formed by physical vapor deposition (PVD), CVD, ALD, or other suitable process. The cap layer 108 may be formed by PVD, CVD, ALD, or other suitable process. In some embodiments, the conductive feature 106 has a thickness along the z-axis ranging from about 50 Angstroms to about 500 Angstroms, and the cap layer 108 has a thickness ranging from about 2 Angstroms to about 50 Angstroms. The conductive features 106 may be electrically connected to conductive contacts beneath the interconnection structure 100.

As shown in FIG. 1E, a glue layer 110, a conductive layer 112, and a hard mask 114 are formed over the layer 102. In some embodiments, the glue layer 110 is formed on the layer 102, the conductive layer 112 is formed on the glue layer 110, and the hard mask 114 is formed on the conductive layer 112. In some embodiments, the glue layer 110 is not present, and the conductive layer 112 is formed on the layer 102. The glue layer 110 may include a nitride, such as a metal nitride, and may be formed by PVD, CVD, ALD, or other suitable process. In some embodiments, the glue layer 110 includes TiN, TaN, WN or other suitable metal nitride. The glue layer 110 may have a thickness ranging from about 2 Angstroms to about 100 Angstroms. The glue layer 110 may provide adhesion between the conductive layer 112 and the conductive feature 106 and the cap layer 108. The conductive layer 112 may include the same material as the conductive feature 106 and may be formed by the same process as the conductive feature 106. The conductive layer 112 may have the same thickness along the z-axis as the conductive feature 106. The hard mask 114 may include TiN, TaN, WN or other suitable metal nitride, and may be formed by PVD, CVD, ALD, or other suitable process. The hard mask 114 may have a thickness ranging from about 2 Angstroms to about 100 Angstroms.

As shown in FIG. 1F, after the glue layer 110, the conductive layer 112 and the hard mask 114 are formed, openings 116 are formed in the hard mask 114, the conductive layer 112, and the glue layer 110. Openings 116 may be formed by first patterning the hard mask 114, followed by transferring the pattern of the hard mask 114 to the conductive layer 112 and the glue layer 110. The openings 116 may be formed by any suitable process, such as wet etch, dry etch, or a combination thereof. In some embodiments, the openings 116 are formed by one or more etch processes. The openings 116 separate the conductive layer 112 into one or more portions, such as a plurality of portions.

FIG. 1F shows an ideal situation that the sidewalls of the openings 116 are vertical. It is understood that, in the actual operations, the sidewalls of the openings 116 may not be vertical and may have an profile angle between about 70 degrees and 90 degrees.

As shown in FIG. 1G, a capping layer 118 is then formed on the exposed surfaces of the portions of the hard mask 114, the conductive layer 112, the glue layer 110, and the dielectric layer 104. The capping layer 118 may provide adhesion to at least the hard mask 114, the conductive layer 112, and the glue layer 110. The capping layer 118 may be made of a dielectric material. In some embodiments, the capping layer 118 includes SiCO, SiCN, SiN, SiCON, $SiO_x$, SiC, SiON, or other suitable dielectric materials. The capping layer 118 may be formed by any suitable process, such as PVD, ALD, CVD, PECVD, PEALD or any suitable conformal process. The term "conformal" may be used herein for ease of description upon a layer having substantial same thickness over various regions. The capping layer 118 may have a thickness ranging from about 5 Angstroms to about 200 Angstroms.

As shown in FIG. 1H, after the formation of the capping layer 118, a sacrificial layer 120 is formed in the openings 116 (FIG. 1G) and on the capping layer 118. The sacrificial layer 120 may include a polymer, such as an organic layer having C, O, N, and/or H. In some embodiments, the sacrificial layer 120 is a degradable gap-fill material such as polyurea. The polyurea may be synthesized by reacting diisocyanate and diamine, which is shown below.

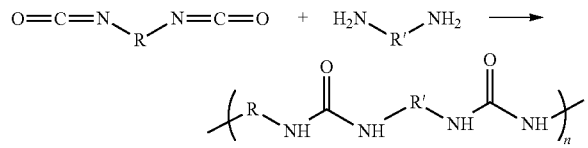

The sacrificial layer 120 may be formed by any suitable process, such as CVD, ALD, molecular layer deposition (MLD), plasma enhanced CVD (PECVD), plasma enhanced ALD (PEALD), or spin-on.

As shown in FIG. 1I, the sacrificial layer 120 is recessed to a level below the level of a top surface 121 of the conductive layer 112. The recess of the sacrificial layer 120 may be performed by any suitable process, such as thermal baking, UV curing, an etch-back process (e.g., a plasma etch process), or any combination thereof. In some embodiments, the sacrificial layer 120 is recessed by a UV curing process that exposes the sacrificial layer 120 to UV energy having an energy density ranging from about 10 mJ/cm$^2$ to about 100 J/cm$^2$. The recess of the sacrificial layer 120 may partially open the openings 116. In some embodiments, the recess of the sacrificial layer 120 may expose at least a portion of the capping layer 118 in the openings 116. The remaining sacrificial layer 120 may have a height H1 ranging from about 10 Angstroms to about 1000 Angstroms.

As shown in FIG. 1J, a support layer 122 is formed on the exposed surfaces of the interconnect structure 100. In some embodiments, the support layer 122 is formed on the sacrificial layer 120 and the capping layer 118. The support layer 122 may provide mechanical strength needed to sustain an air gap (e.g., air gap 124 in FIG. 1K) subsequently formed between the support layer 122 and the capping layer 118. The support layer 122 may include Si, O, N, or any combinations thereof. In some embodiments, the support layer 122 includes SiO$_x$, SiCO, SiNO, SiCN, or SiCON. The support layer 122 may be porous in order to allow UV energy, thermal energy, or plasma, etc., to reach the sacrificial layer 120 disposed therebelow. The support layer 122 may have a thickness ranging from about 2 Angstroms to about 100 Angstroms. The support layer 122 may be formed by any suitable process, such as PVD, CVD, ALD, PECVD, or PEALD. In some embodiments, the support layer 122 is a conformal layer formed by ALD or PEALD.

As shown in FIG. 1K, the sacrificial layer 120 is removed, forming an air gap 124 in each opening 116 between the support layer 122 and the capping layer 118. The removal of the sacrificial layer 120 may be a result of degradation or decomposition of the sacrificial layer 120. The decomposition or degradation of the sacrificial layer 120 may be performed by any suitable process, such as thermal baking and/or UV curing. In some embodiments, an UV curing process is performed to remove the sacrificial layer 120. The UV energy may pass through the porous support layer 122 to reach and remove the sacrificial layer 120. The UV energy may have an energy density ranging from about 10 mJ/cm$^2$ to about 100 J/cm$^2$. The removal of the sacrificial layer 120 does not substantially affect the other layers of the interconnect structure 100. The air gap 124 may have the height H2 ranging from about 10 Angstroms to about 1000 Angstroms, which is substantially the same as the height H1 of the sacrificial layer 120 shown in FIG. 1I. The air gap 124 may reduce capacitive coupling between neighboring portions of the conductive layer 112. If the height H2 is less than about 10 Angstroms, the air gap 124 may not reduce capacitive coupling between neighboring portions of the conductive layer 112. On the other hand, if the height H2 is greater than about 1000 Angstroms, the support layer 122 may not have enough contact on the capping layer 118 to prevent materials subsequently formed on the support layer 122 from collapsing into the air gap 124.

As shown in FIG. 1L, a dielectric fill 126 is formed on the support layer 122. The dielectric fill 126 may enhance isolation of the air gaps 124 and provide adhesion between the support layer 122 and a subsequently formed etch stop layer. The dielectric fill 126 may be a silicon-containing material, such as SiCO, SiCN, SiN, SiCON, SiO$_x$, SiC, or SiON. In some embodiments, the dielectric fill 126 includes a low-k dielectric material having a k value ranging from about 2 to about 3.6, such as SiCOH. The low-k dielectric material may have a porosity ranging from about 0.1 percent to about 40 percent. The dielectric fill 126 may partially fill the openings 116 (FIG. 1K) and over the hard mask 114, as shown in FIG. 1L. The dielectric fill 126 may be formed by CVD, ALD, PECVD, PEALD, or other suitable process.

As shown in FIG. 1M, a planarization process may be performed to remove a portion of the dielectric fill 126 formed over the hard mask 114. Portions of the capping layer 118 and the support layer 122 disposed over the hard mask 114 are also removed as a result of the planarization process. The planarization process may be any suitable process, such as a chemical-mechanical polishing (CMP) process. As a result of the planarization process, a top surface 128 of the hard mask 114 may be substantially co-planar with a top surface 130 of the dielectric fill 126. The remaining dielectric fill 126 may have a thickness ranging from about 2 Angstroms to about 1000 Angstroms. The support layer 122 and the dielectric fill 126 together prevent the materials introduced during the planarization process, for example the slurry, from entering the air gaps 124.

As shown in FIG. 1N, the hard mask 114 is removed by an etch process. The etch process may include one or more selective etch processes, such as dry etch, wet etch, or a combination thereof, to selectively remove the hard mask 114. Once the hard mask 114 is removed, the top surface 121 of the conductive layer 112 may be substantially lower than the top surface 130 of the dielectric fill 126, and the capping layer 118 and the support layer 122 may have a top surface substantially co-planar with the top surface 130 of the dielectric fill 126.

As shown in FIG. 1O, an etch stop layer 132 is formed on the exposed surfaces of the conductive layer 112, the capping layer 118, the support layer 122 and the dielectric fill 126. The etch stop layer 132 may be a single layer or a multi-layer structure. The etch stop layer 132 may include a metal oxide, such as Al, Zr, Y, Hf, or other suitable metal oxide, or a silicon-containing material, such as SiCO, SiCN, SiN, SiCON, SiO$_x$, SiC, SiON, or the like. The etch stop layer 132 may be formed by PVD, CVD, ALD, spin-on, or any suitable deposition process. The etch stop layer 132 may have a thickness ranging from about 1 Angstrom to about 100 Angstroms.

As shown in FIG. 1P, a dielectric material 134 is formed on the etch stop layer 132, and a hard mask 136 is formed on the dielectric material 134. The dielectric material 134 may include the same material as the dielectric fill 126 and may be formed by the same process as the dielectric fill 126. The etch stop layer 132 and the dielectric material 134 may have different etch selectivity. The hard mask 136 may include the same material as the hard mask 114 and may be formed by the same process as the hard mask 114.

As shown in FIG. 1Q, contact openings 138 and 140 are formed in the hard mask 136 and the dielectric material 134. The contact openings 138 and 140 may be formed by any suitable etch/patterning process, such as a dual-damascene process. For example, the contact opening 138 may be first formed by patterning the hard mask 136 and transferring the pattern to a portion of the dielectric material 134. The contact opening 140 is then formed by removing the dielectric material 134 from a portion of a bottom of the contact opening 138. Thus, the contact opening 140 has a smaller dimension than the contact opening 138. In some embodiments, the contact opening 140 is a via and the contact opening 138 is a trench. When forming the contact opening 140, because the etch stop layer 132 and the dielectric material 134 have different etch selectivity, the etch process may be stopped by the etch stop layer 132, and the conductive layer 112, the capping layer 118, the support layer 122 and the dielectric fill 126 beneath the contact opening 140 are protected by the etch stop layer 132 to prevent the over-etching damages.

As shown in FIG. 1R, an etch process may be performed to remove a portion of the etch stop layer 132 exposed by the contact opening 140, so that the contact opening 140 exposes at least the top surface 121 of a portion of the conductive layer 112. In some embodiments, the etch stop layer 132 may be removed by a wet etch process or a dry etch process. In some embodiments, the capping layer 118, the support layer 122 and the etch stop layer 132 may be formed by the same material. When performing the etch process to remove a portion of the etch stop layer 132, a portion of the capping layer 118 and the support layer 122 may be also removed.

In most embodiments, the contact opening 140 is aligned with a portion of the conductive layer 112, such as the portion of the conductive layer 112 disposed between two adjacent air gaps 124. In some embodiments, however, the contact opening 140 may be slightly misaligned with the portion of the conductive layer 112, as shown in FIG. 1R. Because the etch stop layer 132 and the dielectric fill 126 have different etch selectivity, the dielectric fill 126 may be kept when removing the etch stop layer 132.

The misalignment of the via is known as an edge placement error (EPE). If the etch stop layer 132 is not present, the contact opening 140 may be also formed in the dielectric fill 126, because the dielectric material 134 and the dielectric fill 126 may include the same material. As a result, subsequently formed conductive feature may be formed in the dielectric fill 126 between the neighboring portions of the conductive layer 112, which may cause line-to-line leakage. Reliability issues such as poor breakdown voltage or time dependent dielectric breakdown may occur as a result of the line-to-line leakage. With the etch stop layer 132 disposed on the dielectric fill 126, the etch processes utilized to form the contact opening 140 do not substantially affect the etch stop layer 132 due to the different etch selectivity compared to the dielectric material 134 and the etch stop layer 132. Thus, with the etch stop layer 132, the risk of line-to-line leakage is reduced when EPE occurs.

As shown in FIG. 1S, a barrier layer 142 and a conductive feature 144 are formed in the contact openings 138 and 140. The barrier layer 142 may include Co, W, Ru, Al, Mo, Ti, TiN, TiSi, CoSi, NiSi, Cu, TaN, Ni, or TiSiNi and may be formed by any suitable process, such as PVD, ALD, or PECVD. In some embodiments, the barrier layer 142 may be a conformal layer formed by a conformal process, such as ALD, on or in contact with exposed surfaces of the hard mask 136, the dielectric material 134, the etch stop layer 132, the barrier layer 122, the capping layer 118, and the conductive layer 122. The conductive feature 144 may include an electrically conductive material, such as a metal. For example, the conductive feature 144 includes Cu, Ni, Co, Ru, Ir, Al, Pt, Pd, Au, Ag, Os, W, Mo, alloys thereof, or other suitable material. The conductive feature 144 may be formed on the barrier layer 142 by any suitable process, such as electro-chemical plating (ECP), PVD, CVD, or PECVD.

As shown in FIG. 1T, a planarization process is performed to remove a portion of the barrier layer 142 and the conductive feature 144 disposed over the hard mask 136, and the hard mask 136 may be also removed by the planarization process. The planarization process may be any suitable process, such as a CMP process. The top surfaces of the dielectric material 134, the barrier layer 142, and the conductive feature 144 are substantially co-planar upon completion of the planarization process.

Thereafter, a cap layer 146 may be selectively formed on the conductive feature 144 and the barrier layer 142. The metallic surfaces of the conductive feature 144 and the barrier layer 142 may promote the selective growth of the cap layer 146 on the conductive feature 144 and the barrier layer 142, but not on the dielectric material 134. Alternatively, the cap layer 146 may include an electrically conductive material, such as Cu, Co, Ru, Mo, Cr, W, Mn, Rh, Ir, Ni, Pd, Pt, Ag, Au, Al, alloys thereof, or other suitable material. In some embodiments, the cap layer 146 includes a metal. The cap layer 146 may be formed by PVD, CVD, ALD, or other suitable process. The cap layer 146 may have a thickness ranging from about 2 Angstroms to about 50 Angstroms.

As shown in FIG. 1T, the interconnection structure 100 includes the dielectric layer 104, the conductive feature 106 disposed in the dielectric layer 104, the conductive layer 112 including a first portion and a second portion, the capping layer 118 having a first portion, a second portion opposing the first portion, and a third portion connecting the first portion and the second portion, the support layer 122 in contact with the first and second portions of the capping layer, and the etch stop layer 132 disposed over the second portion of the conductive layer 112, the second portion of the capping layer 118 and the support layer 122. The first portion of the conductive layer 112 is disposed over the first conductive feature 106, and the second portion of the conductive layer 112 is disposed over the dielectric layer 104. The first portion of the capping layer 118 is in contact with the first portion of the conductive layer 112, the second portion of the capping layer 118 is in contact with the second portion of the conductive layer 112, and the third portion of the capping layer 118 is in contact with the dielectric layer 104. The air gap 124 is defined by the support layer 122, the first portion of the capping layer 118, the second portion of the capping layer 118, and the third portion of the capping layer 118, and the air gap 124 is disposed between the first portion of the conductive layer 112 and the second portion of the conductive layer 112.

An ILD layer or an intermetal dielectric (IMD) layer may be formed on the cap layer 146 and the dielectric material 134, and the processes discussed above with respect to FIGS. 1D-1T may be repeated until a desired number of back-end-of-line (BEOL) interconnect structures is achieved.

Figure 2B:
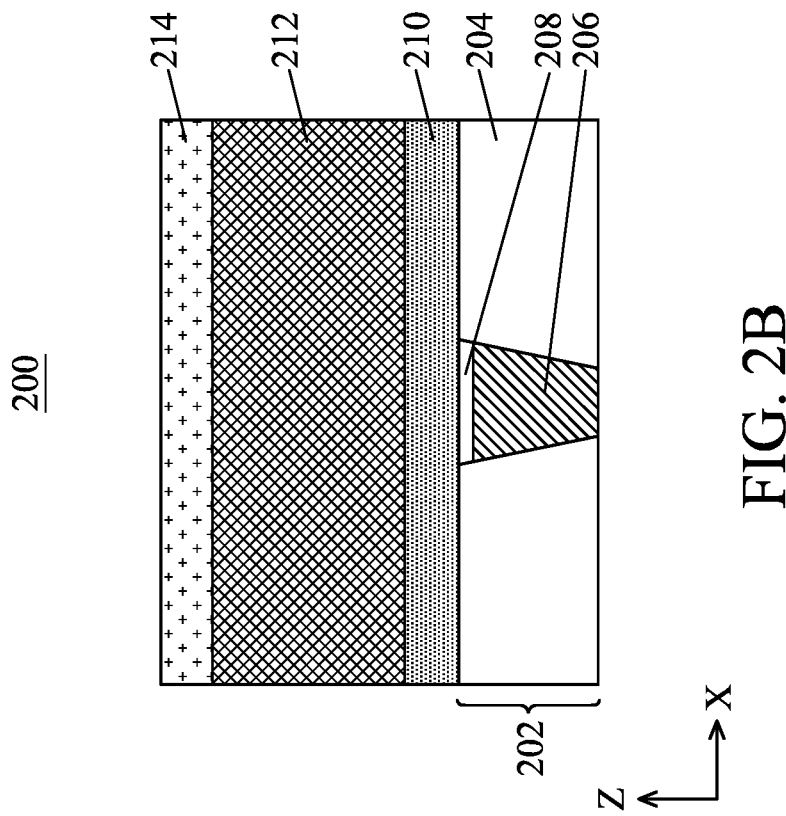
FIGS. 2A-2S are cross-sectional side views of various stages of manufacturing another interconnect structure, in accordance with some embodiments.
Figure 2A:
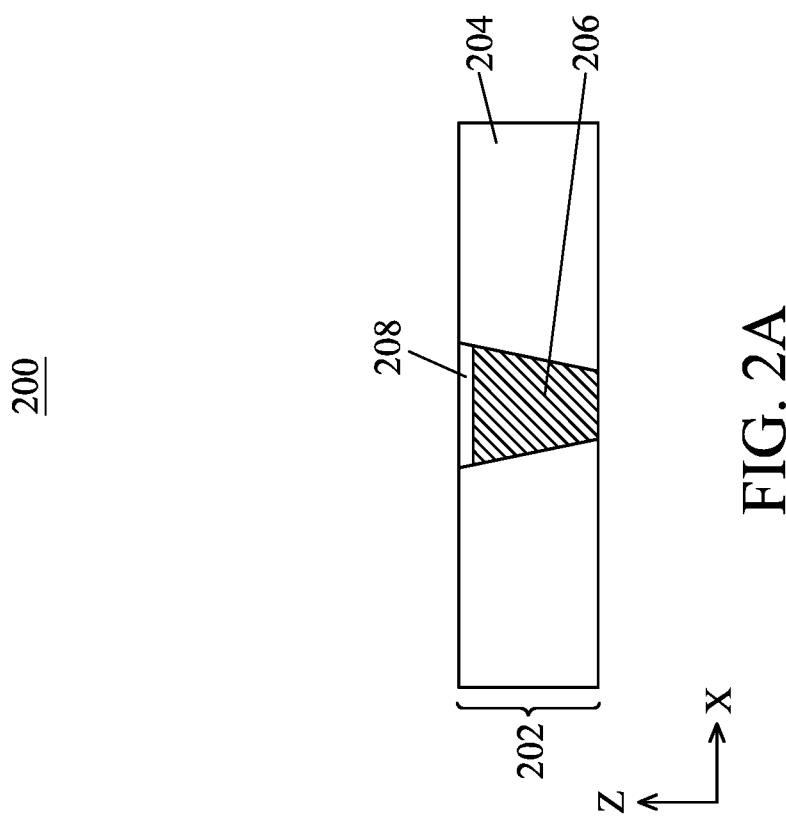
Figure 2C:
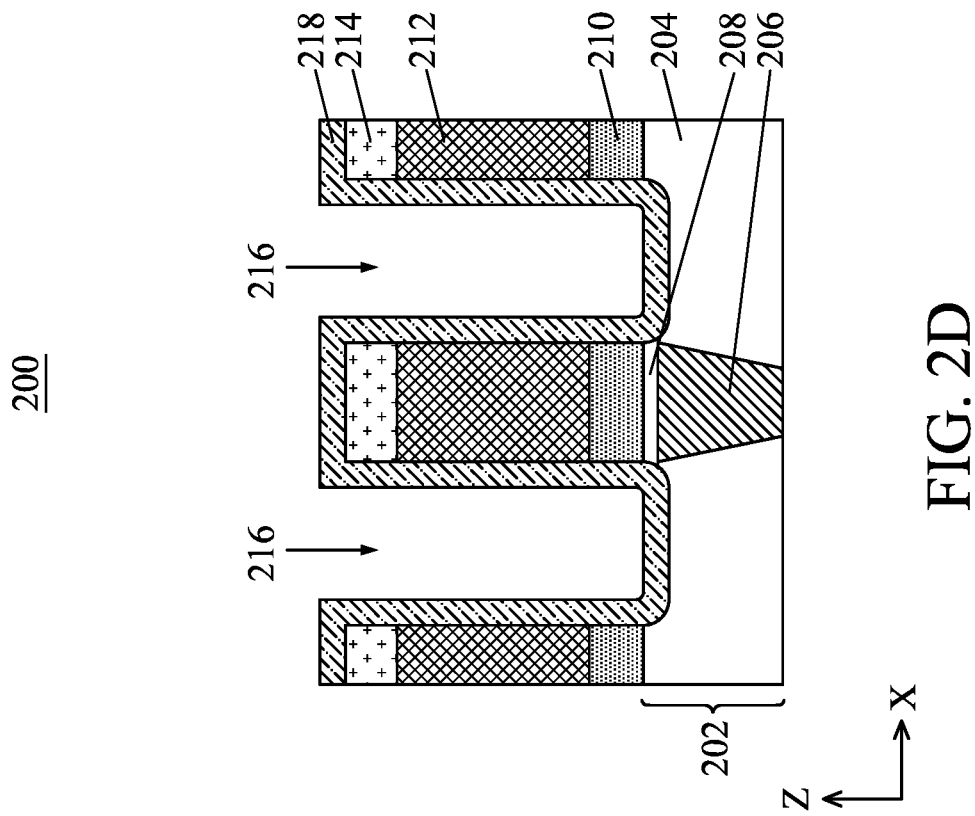
Figure 2D:
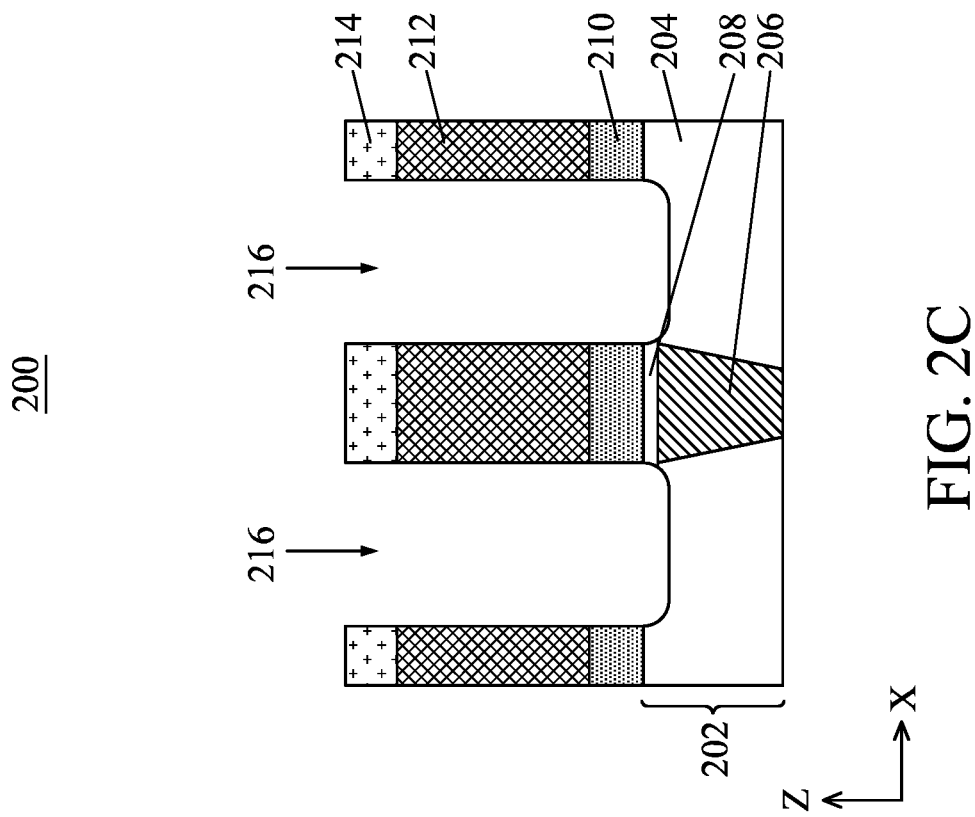
Figure 2F:
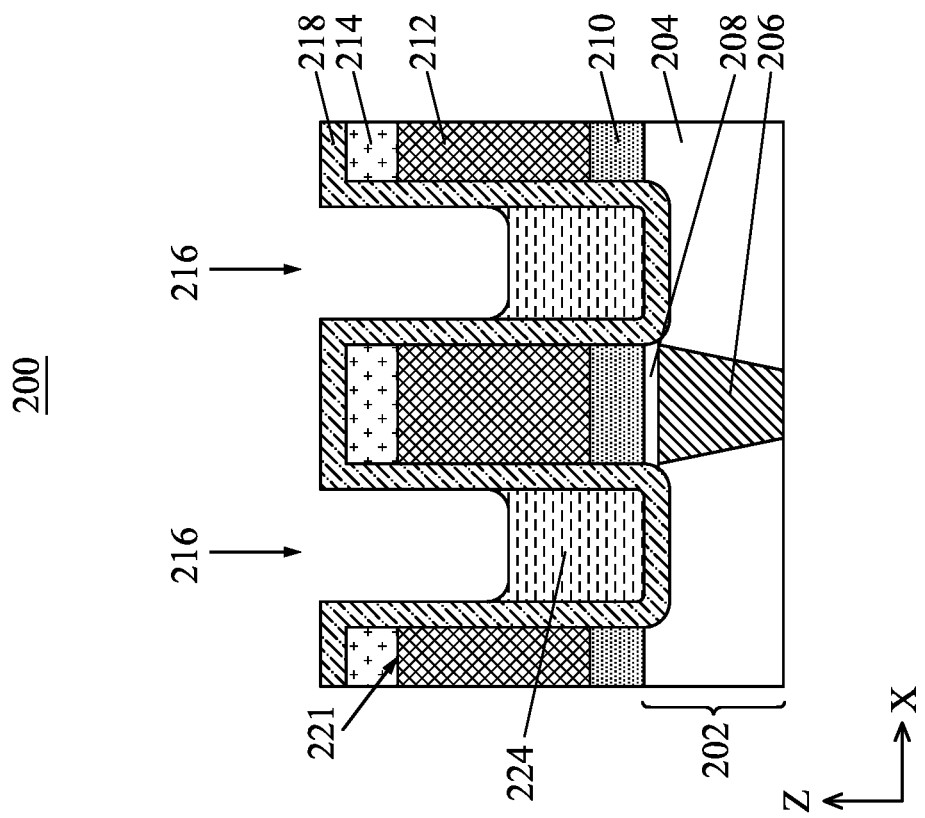
Figure 2E:
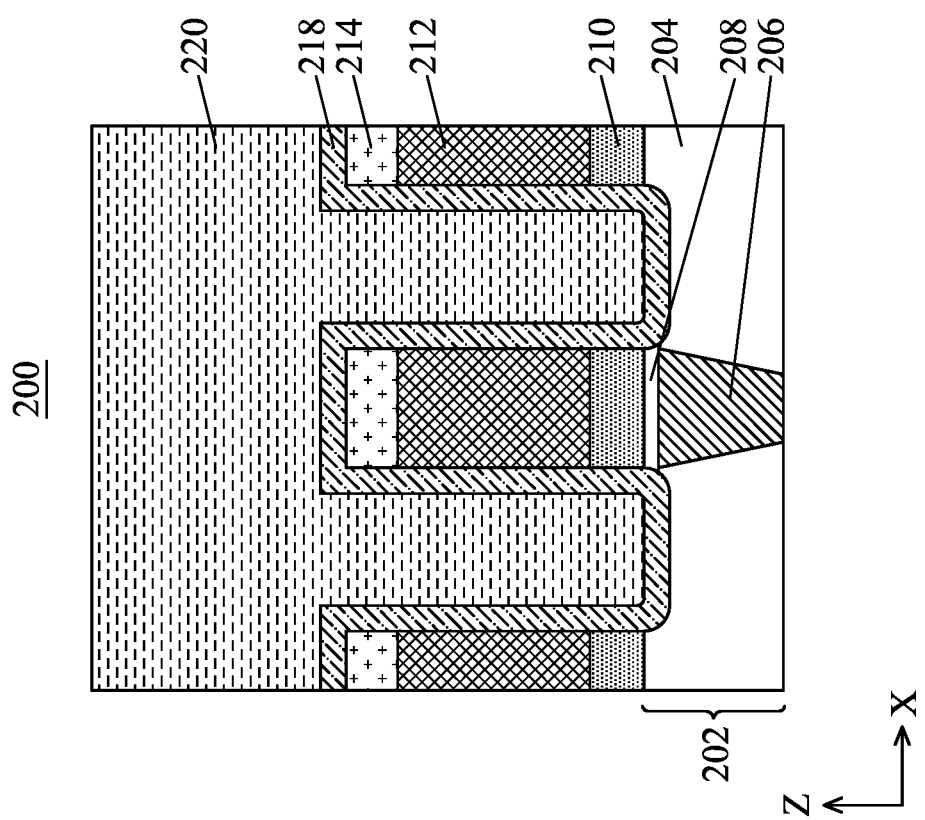
Figure 2I:
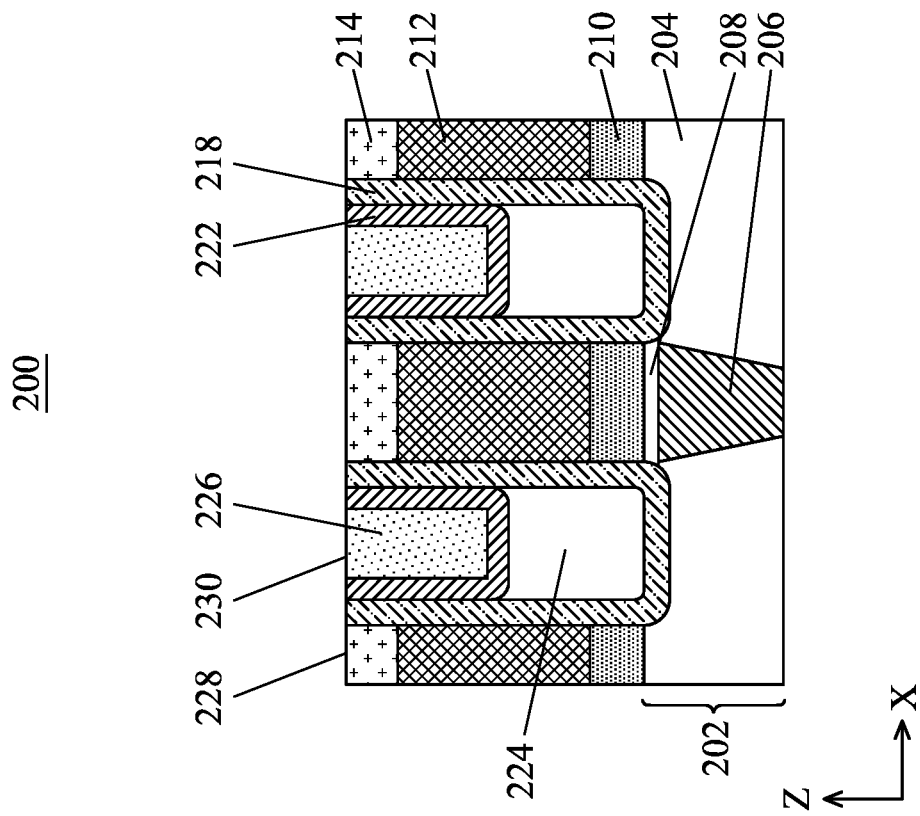
Figure 2J:
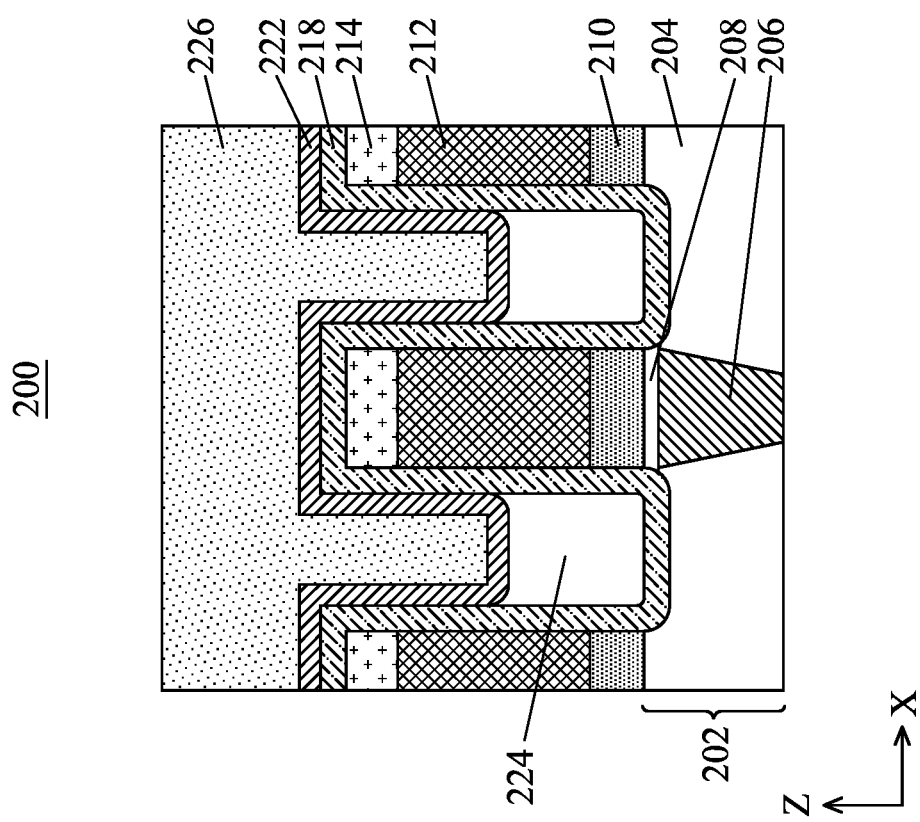
Figure 2K:
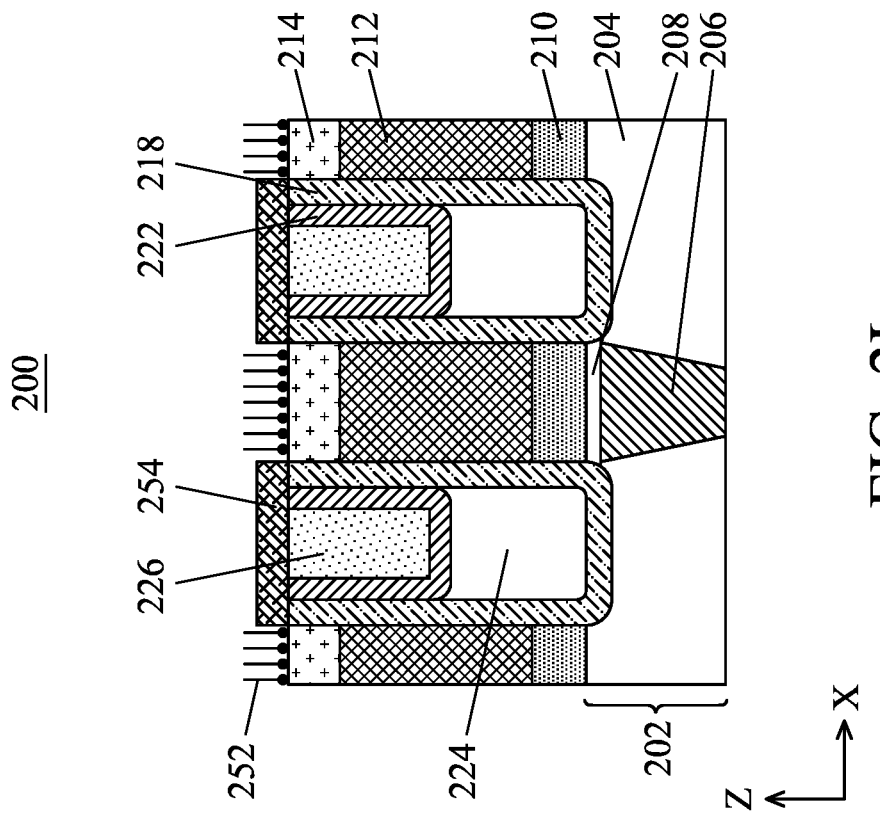
Figure 2L:
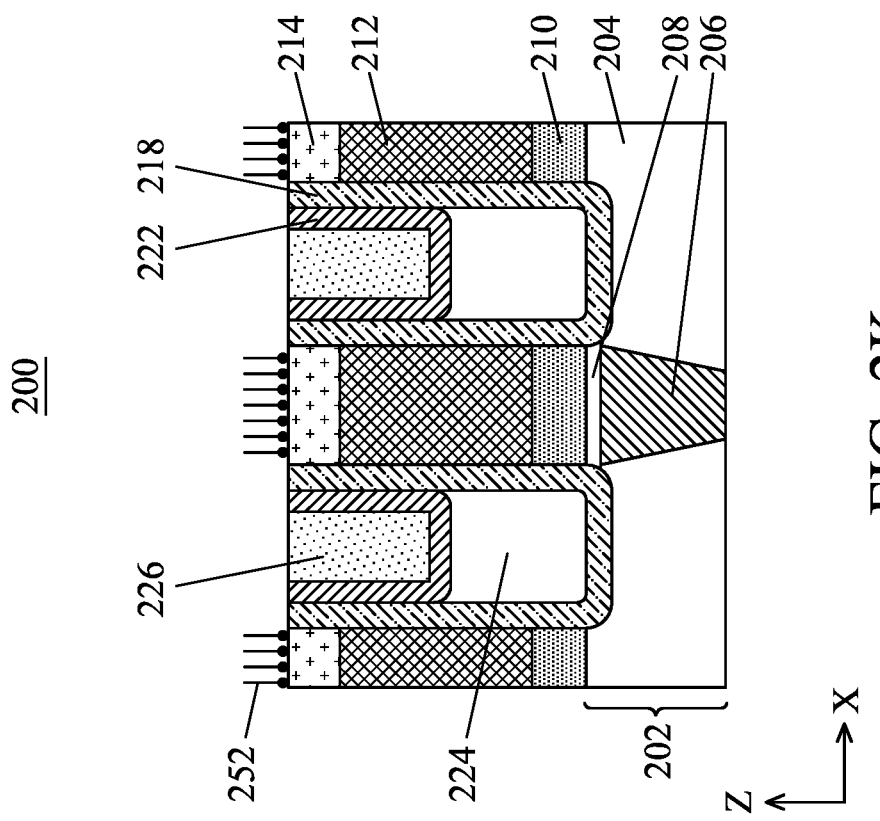
Figure 2M:
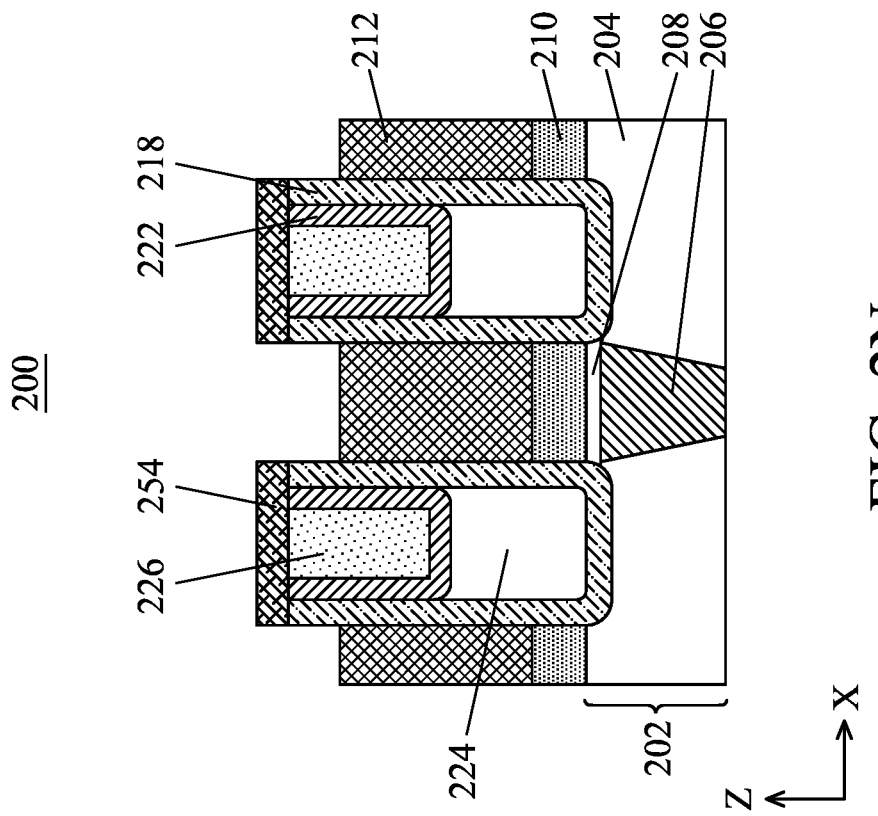
Figure 2N:
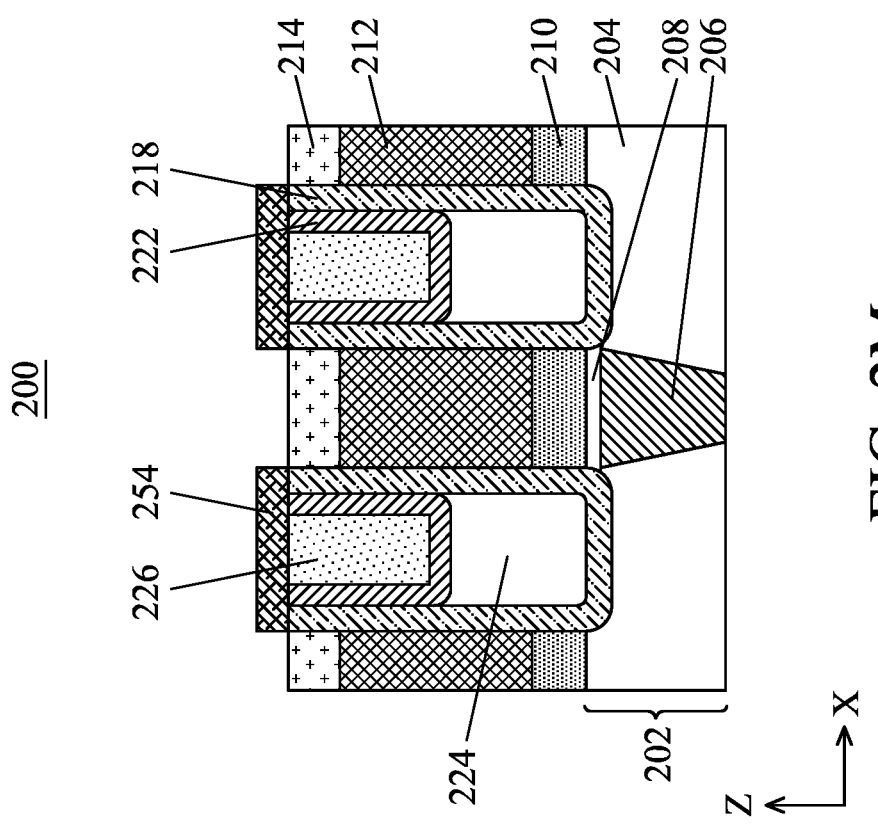
Figure 2O:
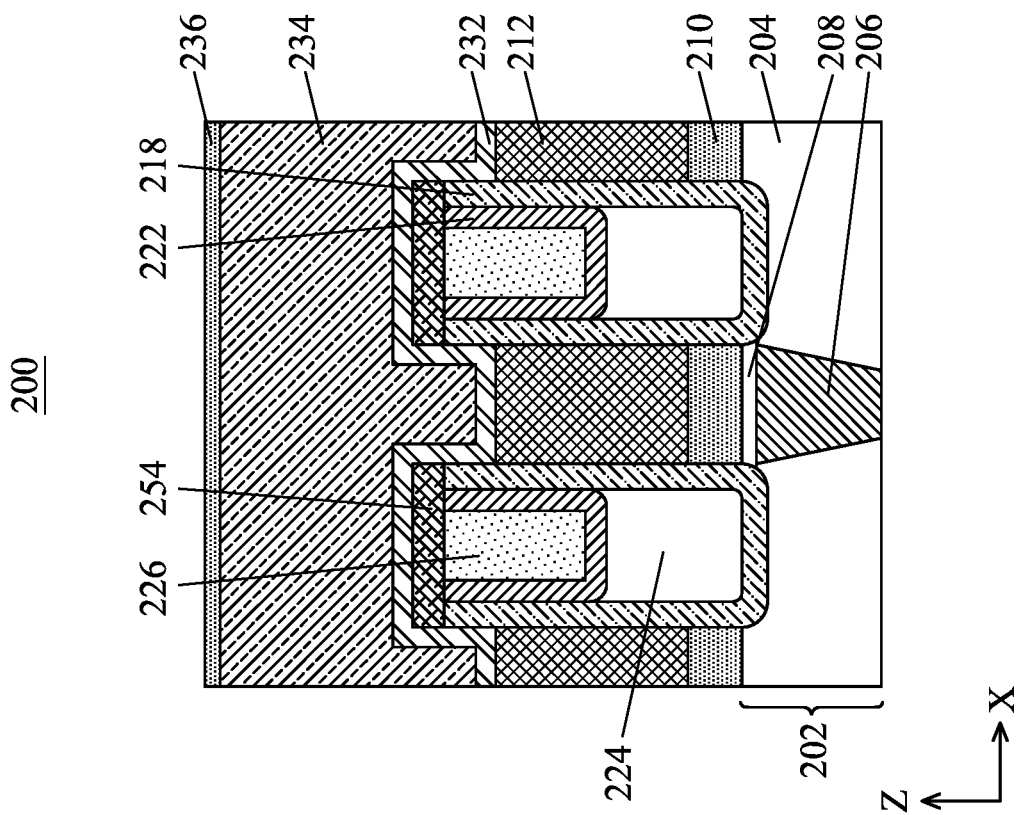
Figure 2P:
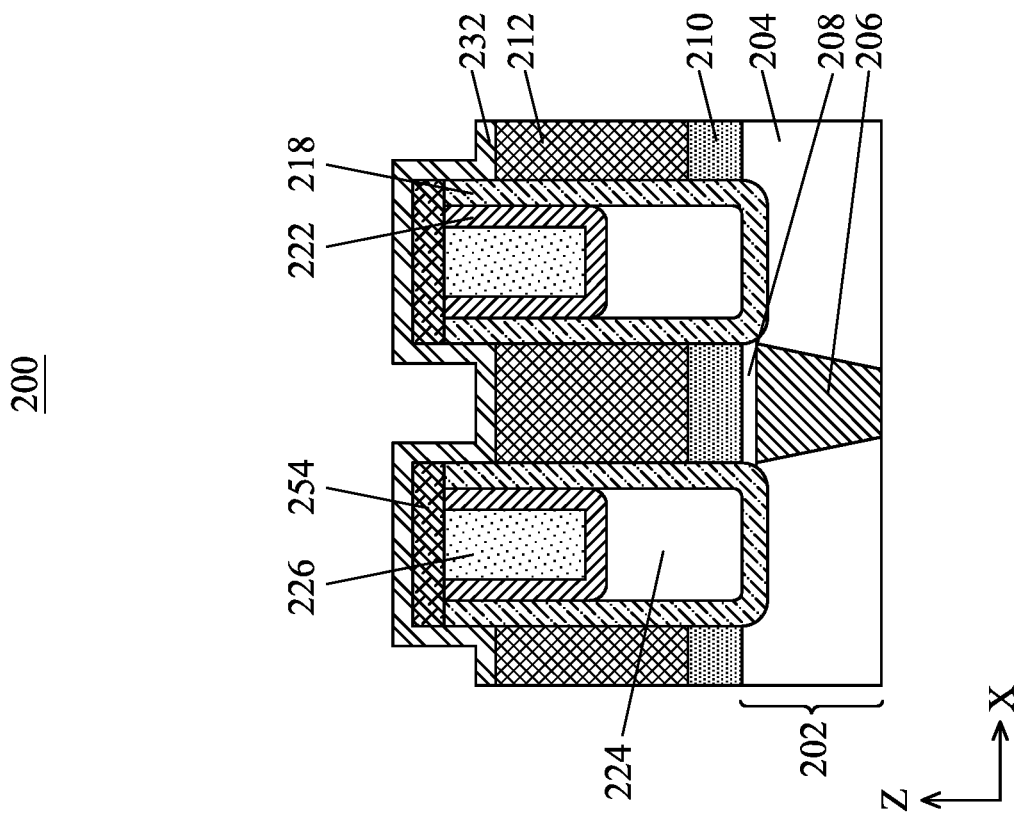
Figure 2Q:
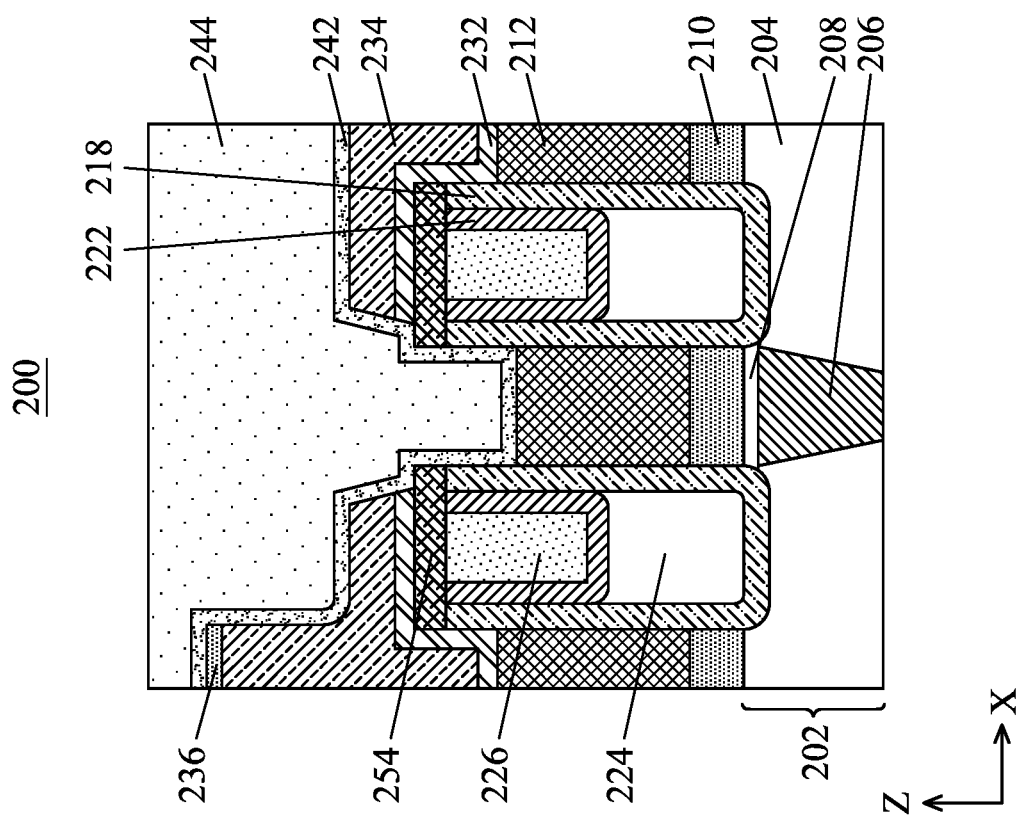
Figure 2R:
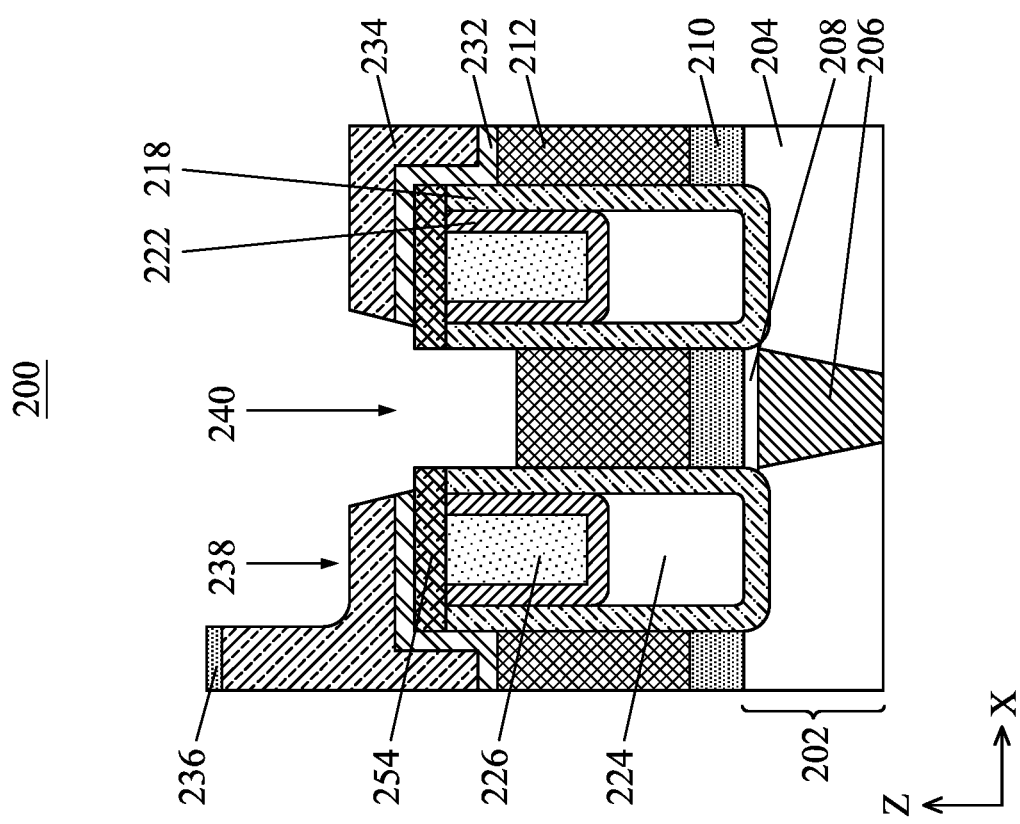
Figure 2S:
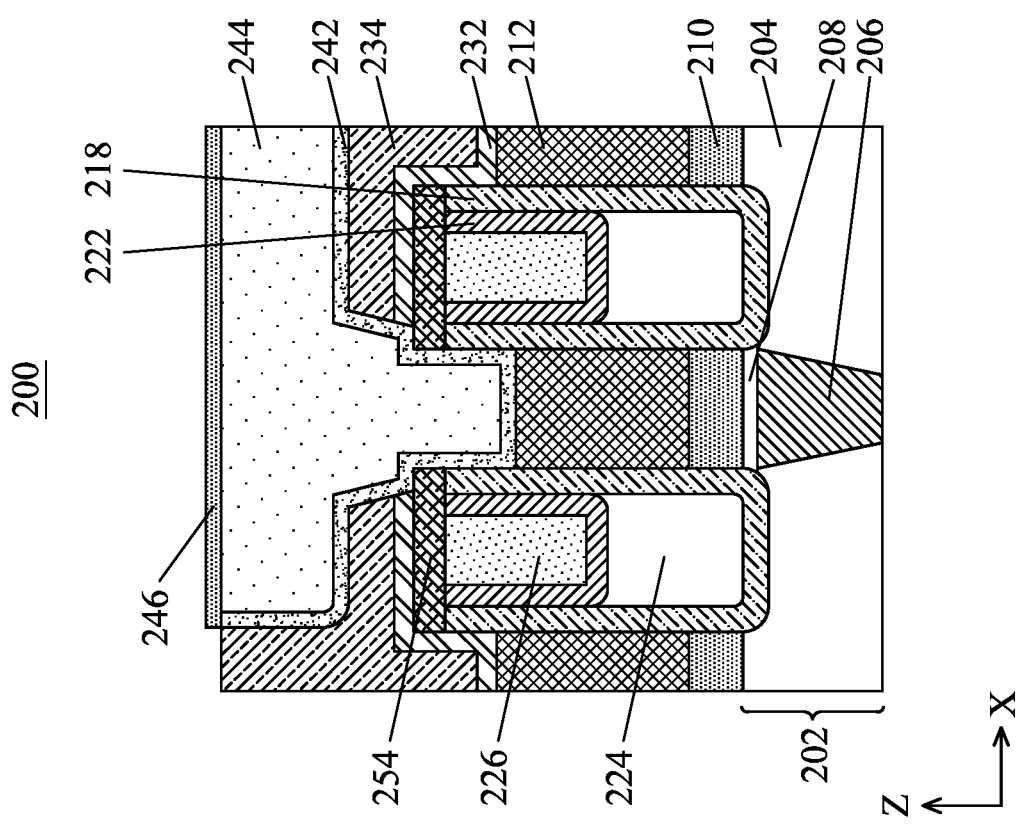

FIGS. 2A-2S are cross-sectional side views of various stages of manufacturing another interconnect structure 200, in accordance with some embodiments. The interconnect structure 200 may be formed on various devices of a semiconductor structure. For example, the interconnect structure 200 may be formed on one or more devices, such as transistors, diodes, imaging sensors, resistors, capacitors, inductors, memory cells, combinations thereof, and/or other suitable devices. In some embodiments, the interconnect structure 200 may be formed on the transistors, such as nanostructure FET having a plurality of channels wrapped around by a gate electrode layer.

As shown in FIG. 2A, the interconnection structure 200 includes a layer 202, which may be an ILD layer or an intermetal dielectric (IMD) layer. The layer 202 includes a dielectric layer 204, one or more conductive features 206 (only one is shown) disposed in the dielectric layer 204, and an optional cap layer 208 disposed on each conductive feature 206. The material and the process of forming the dielectric layer 204 may be similar to the material and the process of forming the dielectric layer 104. In some embodiments, the dielectric layer 204 includes silicon oxide. The material, the thickness, and the process of forming the conductive feature 206 and the cap layer 208 may be similar to the material, the thickness, and the process of forming the conductive feature 106 and the cap layer 108. The conductive features 206 may be electrically connected to conductive contacts beneath the interconnection structure 200.

As shown in FIG. 2B, a glue layer 210, a conductive layer 212, and a hard mask 214 are formed over the layer 202. In some embodiment, the glue layer 210 is formed on the layer 202, the conductive layer 212 is formed on the glue layer 210, and the hard mask 214 is formed on the conductive layer 212. In some embodiments, the glue layer 210 is not present, and the conductive layer 212 is formed on the layer 202. The material, the thickness, and the process of forming the glue layer 210 may be similar to the material, the thickness, and the process of forming the glue layer 110. The glue layer 210 may provide adhesion between the conductive layer 212 and the conductive feature 206 and the cap layer 208. The conductive layer 212 may include the same material as the conductive feature 206 and may be formed by the same process as the conductive feature 206. The conductive layer 212 may have the same thickness as the conductive feature 206. The hard mask 214 may include TiN, TaN, WN or other suitable metal nitride, and may be formed by PVD, CVD, ALD, or other suitable process. The hard mask 214 may have a thickness ranging from about 2 Angstroms to about 100 Angstroms.

As shown in FIG. 2C, after the glue layer 210, the conductive layer 212 and the hard mask 214 are formed, openings 216 are formed in the hard mask 214, the conductive layer 212, and the glue layer 210. The process of forming the openings 216 may be similar to the process of forming the openings 116. The openings 216 separate the conductive layer 212 into one or more portions, such as a plurality of portions.

FIG. 2C shows an ideal situation that the sidewalls of the openings 216 are vertical. It is understood that, in the actual operations, the sidewalls of the openings 216 may not be vertical and may have an profile angle between about 70 degrees and 90 degrees.

As shown in FIG. 2D, a capping layer 218 is then formed on the exposed surfaces of the portions of the hard mask 214, the conductive layer 212, the glue layer 210, and the dielectric layer 204. The capping layer 218 may provide adhesion to at least the hard mask 214, the conductive layer 212, and the glue layer 210. The material, the thickness, and the process of forming the capping layer 218 may be similar to the material, the thickness, and the process of forming the capping layer 118.

As shown in FIG. 2E, after the formation of the capping layer 218, a sacrificial layer 220 is formed in the openings 216 (FIG. 2D) and on the capping layer 218. The material and the process of forming the sacrificial layer 220 may be similar to the material and the process of forming the sacrificial layer 120.

As shown in FIG. 2F, the sacrificial layer 220 is recessed to a level below the level of a top surface 221 of the conductive layer 212. The recess of the sacrificial layer 220 may partially open the openings 216. In some embodiments, the recess of the sacrificial layer 220 may expose at least a portion of the capping layer 218 in the openings 216. The recess of the sacrificial layer 220 may be performed by process similar to the recess of the sacrificial layer 120, and the remaining sacrificial layer 220 may have a height similar to the remaining sacrificial layer 120.

As shown in FIG. 2G, a support layer 222 is formed on the exposed surfaces of the interconnect structure 200. In some embodiments, the support layer 222 is formed on the sacrificial layer 220 and the capping layer 218. The support layer 222 may provide mechanical strength needed to sustain an air gap (e.g., air gap 224 in FIG. 2H) subsequently formed between the support layer 222 and the capping layer 218. The material, the thickness, and the process of forming the support layer 222 may be similar to the material, the thickness, and the process of forming the support layer 122.

As shown in FIG. 2H, the sacrificial layer 220 is removed, forming an air gap 224 in each opening 216 between the support layer 222 and the capping layer 218. The removal of the sacrificial layer 220 may be performed by process similar to the removal of the sacrificial layer 120, and the air gap 224 may have a height similar to the air gap 124.

As shown in FIG. 2I, a dielectric fill 226 is formed on the support layer 222. The dielectric fill 226 may enhance isolation of the air gaps 224 and provide adhesion between the support layer 222 and the subsequently formed etch stop layer 232. The material, the thickness, and the process of forming the dielectric fill 226 may be similar to the material, the thickness, and the process of forming the dielectric fill 126.

As shown in FIG. 2J, a planarization process may be performed to remove a portion of the dielectric fill 226 formed over the hard mask 214. Portions of the capping layer 218 and the support layer 222 disposed over the hard mask 214 are also removed as a result of the planarization process. The planarization process may be any suitable process, such as a chemical-mechanical polishing (CMP) process. As a result of the planarization process, a top surface 228 of the hard mask 214 may be substantially co-planar with a top surface 230 of the dielectric fill 226. The remaining dielectric fill 226 may have a thickness ranging from about 10 Angstroms to about 700 Angstroms. The support layer 222 and the dielectric fill 226 together prevent the materials introduced during the planarization process, for example the slurry, from entering the air gaps 224.

As shown in FIG. 2K, a treatment process may be performed to selectively form a blocking layer 252 on the top surface 228 of the hard mask 214. The treatment process may be an ALD, CVD, spin-on or dipping process. The blocking layer 252 may include a compound having a phosphorus, sulfur, silicon or nitrogen head group to bond with the top surface 228 of the hard mask 214. Because the hard mask 214 is a metal material but the dielectric fill 226, the support layer 222 and the capping layer 218 are dielectric materials, the head group of the blocking layer 252 may only bond with the metal material in the treatment process, e.g., the CVD process. The blocking layer 252 is not formed on the top surface of the dielectric fill 226, the support layer 222 and the capping layer 218. In some embodiments, the blocking layer 252 may include 1-Octadecanethiol, 1-Dodecanethiol, Stearic acid, 4-Dodecylbenzenesulfonic acid, dimethyl octadecylphosphonate, Bi(Dodecyl) Dithiophosphinic Acids, Bi(octadecyl) Dithiophosphinic Acids, Diethyl-n-Octadecylphosphonate, Octadecylphosphonic acid, Decylpho sphonic acid, Tetradecylphosphonic acid, 2-mercaptobenzothiazole, 2-mercaptobenzoxazole, 2-mercaptobenzimidazole, Benzothiazol, Benzoxazole, Benzimidazole, 2-Methylbenzimidazole, 5,6-Dimethylbenzimidazole, 2-(Methylthio)benzimidazole, 1,2,3-triazole, 1,2,4-triazole, 3-Amino-1,2,4-triazole, 1-Hydroxybenzotriazole hydrate, 4-Methyl-1H-benzotriazole, 5-Methyl-1H-benzotriazole, 5,6-Dimethyl-1H-benzotriazole, 4-Hydroxy-1H-benzotriazole, Benzotriazole-1-carboxamide, 2-Methylbenzothiazole, Imidazole, Methimazole, 5-Phenyl-1H-tetrazole, Benzotriazole, 5-(3-Aminophenyl)tetrazole, 4-Amino-4H-1, 2,4-triazole, 3-Amino-5-mercapto-1,2,4-triazole, 3-Amino-5-methylthio-1H-1,2,4-triazole, 2-aminopyrimidine, 2-mercaptopyrimidine, Adenine, Hypoxanthine, Morpholine, 5-Amino-1,3,4-thiadiazole-2-thiol, Tryptophan, Histidine, 5-(Trifluoromethyl)-1H-1,2,3-benzotriazole, 1H-Benzotriazole,1-(4-morpholinylmethyl), Phenothiazine, Purine, Melamine, Trithiocyanuric acid, 1,3,4-Thiadiazole-2,5-diamine, 3,5-Diamino-1,2,4-triazole, 5-Aminotetrazole, 3,6-Bis(methylthio)-1,2,4,5-tetrazine, Aminophylline, or other suitable compound. In some embodiments, the blocking layer 252 may have a thickness range from about 2 Angstroms to about 50 Angstroms.

As shown in FIG. 2L, a metal oxide layer 254 is formed on the exposed top surface of the dielectric fill 226, the support layer 222 and the capping layer 218. Since the blocking layer 252 may block precursor while forming the metal oxide layer 254, the metal oxide layer 254 grows on the dielectric fill 226, the support layer 222 and the capping layer 218, and does not grow on the top surface of the blocking layer 252. In some embodiments, the metal oxide layer 254 may be composed of oxide formed from Al, Ti, Zr, Hf, Y or others metal oxide precursor, and the metal oxide layer 254 may be formed by a CVD, ALD or spin-on process. In some embodiments, the metal oxide layer 254 may have a thickness range from about 1 Angstroms to about 100 Angstroms.

As shown in FIG. 2M, a removal process is performed to selectively remove the blocking layer 252 and keep the metal oxide layer 254. The removal process of the blocking layer 252 may be formed by any suitable process, such as wet etch, dry etch, or a combination thereof. After the removal of the blocking layer 252, as shown in FIG. 2N, the hard mask 214 is removed by an etch process. The etch process may include one or more selective etch processes, such as dry etch, wet etch, or a combination thereof, to selectively remove the hard mask 214. Once the hard mask 214 is removed, the top surface 221 of the conductive layer 212 may be substantially lower than the top surface 230 of the dielectric fill 226, and the top surface 221 of the conductive layer 212 may be substantially lower than the top surface of the metal oxide layer 254.

As shown in FIG. 2O, an etch stop layer 232 is formed on the exposed surfaces of the conductive layer 212, the capping layer 218 and the metal oxide layer 254. The etch stop layer 232 may be a single layer or a multi-layer structure.

The material, the thickness, and the process of forming the etch stop layer 232 may be similar to the material, the thickness, and the process of forming the etch stop layer 132.

As shown in FIG. 2P, a dielectric material 234 is formed on the etch stop layer 232, and a hard mask 236 is formed on the dielectric material 234. The dielectric material 234 may include the same material as the dielectric fill 226 and may be formed by the same process as the dielectric fill 226. The etch stop layer 232 and the dielectric material 234 may have different etch selectivity or similar etch selectivity. The hard mask 236 may include the same material as the hard mask 214 and may be formed by the same process as the hard mask 214.

As shown in FIG. 2Q, contact openings 238 and 240 are formed in the hard mask 236, the dielectric material 234 and the etch stop layer 232. The contact openings 238 and 240 may be formed by any suitable etch/patterning process, such as a dual-damascene process. For example, the contact opening 238 may be first formed by patterning the hard mask 236 and transferring the pattern to a portion of the dielectric material 234. The contact opening 240 is then formed by etching through the dielectric material 234 from a portion of a bottom of the contact opening 238. Thus, the contact opening 240 has a smaller dimension than the contact opening 238. In some embodiments, the contact opening 240 is a via and the contact opening 238 is a trench. In some embodiments, when forming the contact opening 240, in the situation that the etch stop layer 232 and the dielectric material 234 have different etch selectivity, the etch process may be stopped by the etch stop layer 232, and another etch process is required to remove a portion of the etch stop layer 232. In some embodiments, when forming the contact opening 240, in the situation that the etch stop layer 232 and the dielectric material 234 have similar etch selectivity, the etch process may be stopped by the metal oxide layer 254. The conductive layer 212, the capping layer 218, the support layer 222 and the dielectric fill 226 beneath the contact opening 240 are protected by the metal oxide layer 254 to prevent the over-etching damages.

In most embodiments, the contact opening 240 is aligned with a portion of the conductive layer 212, such as the portion of the conductive layer 212 disposed between two adjacent air gaps 224. In some embodiments, however, the contact opening 240 may be slightly misaligned with the portion of the conductive layer 212. Because the metal oxide layer 254 is formed on the dielectric fill 226, the dielectric fill 226 may be kept when removing the dielectric material 234 and the etch stop layer 232. With the metal oxide layer 254 disposed on the dielectric fill 226, the etch processes utilized to form the contact opening 240 do not substantially affect the dielectric fill 226. Thus, with the metal oxide layer 254, the risk of line-to-line leakage is reduced when EPE occurs.

As shown in FIG. 2R, a barrier layer 242 and a conductive feature 244 are formed in the contact openings 238 and 240. The material and the process of forming the barrier layer 242 and the conductive feature 244 may be similar to the material and the process of forming the barrier layer 142 and the conductive feature 144.

As shown in FIG. 2S, a planarization process is performed to remove a portion of the barrier layer 242 and the conductive feature 244 disposed over the hard mask 236, and the hard mask 236 may be also removed by the planarization process. The planarization process may be any suitable process, such as a CMP process. The top surfaces of the dielectric material 234, the barrier layer 242, and the conductive feature 244 are substantially co-planar upon completion of the planarization process. Thereafter, a cap layer 246 may be selectively formed on the conductive feature 244 and the barrier layer 242. The material and the process of forming the cap layer 246 may be similar to the material and the process of forming the cap layer 146.

As shown in FIG. 2S, the interconnection structure 200 includes the dielectric layer 204, the first conductive feature 206 disposed in the dielectric layer 204, the conductive layer 212 including a first portion and a second portion, the capping layer 218 having a first portion, a second portion opposing the first portion, and a third portion connecting the first portion and the second portion, the support layer 222 in contact with the first and second portions of the capping layer 218, the dielectric fill 226 disposed over the air gap 224 and in contact with the support layer 222, and the metal oxide layer 254 disposed over the dielectric fill 226, the support layer 222, the first portion of the capping layer 218 and the second portion of the capping layer 218. The first portion of the conductive layer 212 is disposed over the first conductive feature 206, and the second portion of the conductive layer 212 is disposed over the dielectric layer 204. The first portion of the capping layer 218 is in contact with the first portion of the conductive layer 212, the second portion of the capping layer 218 is in contact with the second portion of the conductive layer 212, and the third portion of the capping layer 218 is in contact with the dielectric layer 204. The air gap 224 is defined by the support layer 222, the first portion of the capping layer 218, the second portion of the capping layer 218, and the third portion of the capping layer 218, and the air gap 224 is disposed between the first portion of the conductive layer 212 and the second portion of the conductive layer 212.

An ILD layer or an intermetal dielectric (IMD) layer may be formed on the cap layer 246 and the dielectric material 234, and the processes discussed above with respect to FIGS. 2A-2S may be repeated until a desired number of back-end-of-line (BEOL) interconnect structures is achieved.

Figure 3:
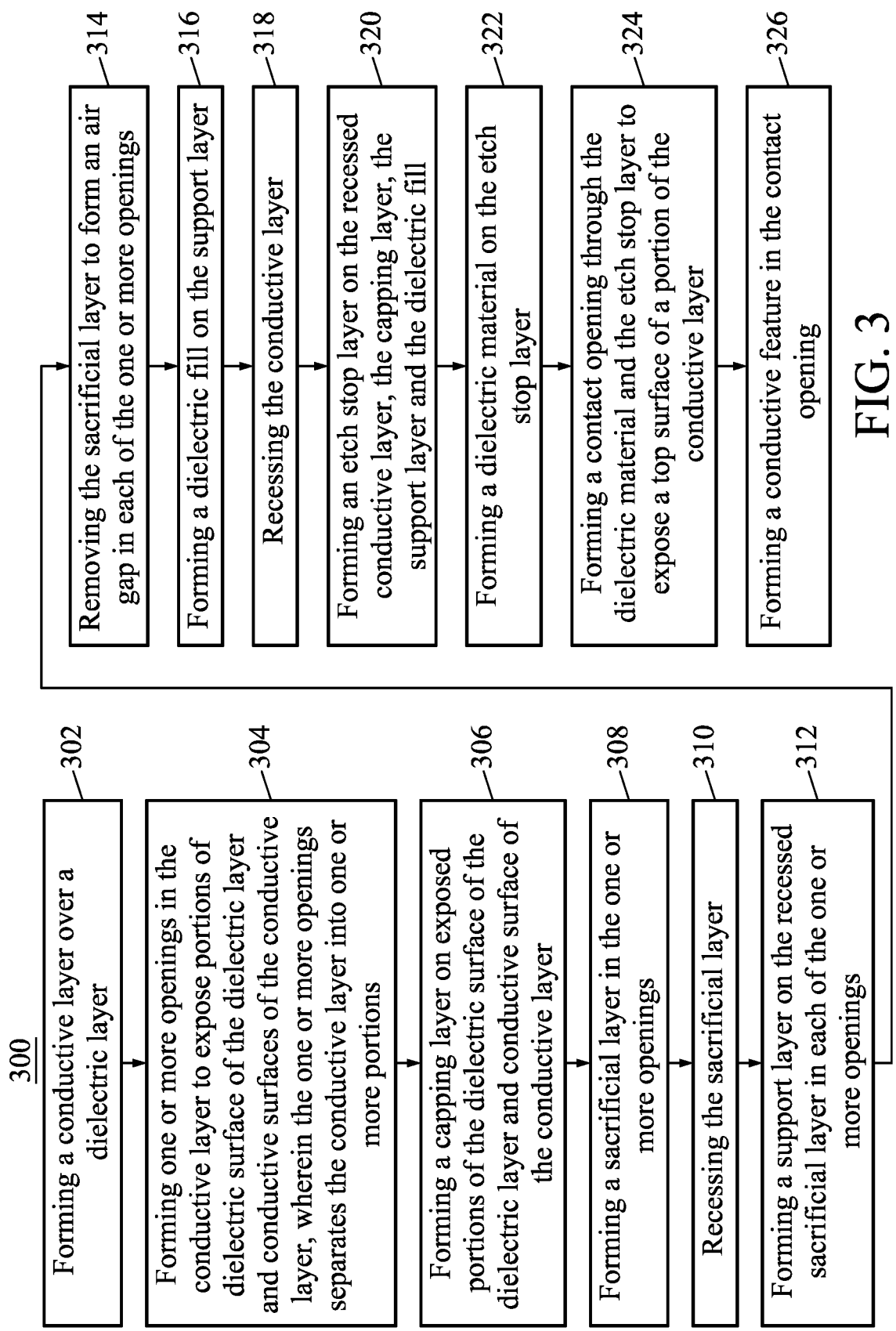
FIG. 3 is a flow chart of a method of manufacturing an interconnect structure in accordance with some embodiments.

FIG. 3 is a flow chart showing a method 300 of forming the interconnection structure 100 or 200, in accordance with some embodiments. It is noted that the operations of the method 300, including any descriptions given with reference to the figures, are merely exemplary and are not intended to be limiting beyond what is specifically recited in the claims that follow. Additional operations may be implemented before, during, and after the method 300, and some operations may be replaced, eliminated, or rearranged in any desired order in accordance with various embodiments of the method 300.

The method 300 starts at operation 302 by forming a conductive layer over a dielectric layer. The conductive layer may be the conductive layer 112 or 212, and the dielectric layer may be the dielectric layer 104 or 204. In some embodiments, the conductive layer may further include a conductive mask layer, such as the mask layer 114 or 214 formed on the conductive layer 112 or 212. The dielectric layer 104 or 204 may have one or more conductive features (such as the conductive features 106 or 206) formed therein. The conductive layer and the dielectric layer may be formed by the processes discussed above with respect to FIGS. 1A-1B and 2A-2B.

At operation 304, one or more openings are formed in the conductive layer to expose portions of dielectric surface of the dielectric layer and conductive surfaces of the conductive layer, wherein the one or more openings separates the conductive layer into one or more portions. The one or more openings may be the one or more openings 116 or 216, portions of dielectric surface of the dielectric layer may be the exposed surface of the dielectric layer 104 or 204, and the conductive surfaces may be the conductive surfaces of the conductive layer 112 or 212. The openings may be formed by the processes discussed above with respect to FIGS. 1C and 2C.

At operation 306, a capping layer is formed on exposed portions of the dielectric surface of the dielectric layer and conductive surface of the conductive layer. The capping layer may be the capping layer 118 or 218. The capping layer may be formed by the processes discussed above with respect to FIG. 1D and 2D.

At operation 308, a sacrificial layer is formed in the one or more openings. The sacrificial layer may be the sacrificial layer 120 or 220. At operation 310, the sacrificial layer is recessed to have a height (such as the height H1 shown in FIG. 1F) in the openings. The sacrificial layer may be formed by the processes discussed above with respect to FIGS. 1E-1F and 2E-2F.

At operation 312, a support layer is formed on the recessed sacrificial layer in each of the one or more openings, and at operation 314, the sacrificial layer is removed to form an air gap in each of the one or more openings. The support layer may be the support layer 122 or 222, and the air gaps may be the air gaps 124 or 224. The support layer and the air gaps may be formed by the processes discussed above with respect to FIGS. 1G-1H and 2G-2H.

At operation 316, a dielectric fill is formed on the support layer. The dielectric fill may be the dielectric fill 126 or 226. The dielectric fill may be formed by the processes discussed above with respect to FIGS. 1I-1J and 2I-2J.

In some embodiments, after operation 316, a metal oxide layer is selectively formed on the capping layer, the support layer and the dielectric fill. The metal oxide layer may be the metal oxide layer 254, and the metal oxide layer may be formed by the processes discussed above with respect to FIGS. 2K-2M.

At operation 318, the conductive layer is recessed. The removed conductive layer may be the hard mask 114 or 214. The conductive layer may be recessed by the processes discussed above with respect to FIGS. 1K and 2N.

At operation 320, an etch stop layer is formed on the recessed conductive layer, the capping layer, the support layer and the dielectric fill. In the situation that the metal oxide layer is formed on the capping layer, the support layer and the dielectric fill, the etch stop layer is formed on the recessed conductive layer, the capping layer and the metal oxide layer. The etch stop layer may be the etch stop layer 132 or 232. The etch stop layer may be formed by the processes discussed above with respect to FIGS. 1L and 2O.

At operation 322, a dielectric material is formed on the etch stop layer. The dielectric material may be the dielectric material 134 or 234. The dielectric material may be formed by the processes discussed above with respect to FIGS. 1M and 2P.

At operation 324, a contact opening is formed through the dielectric material and the etch stop layer to expose a top surface of a portion of the conductive layer. The contact opening may be the contact opening 140 or 240. The contact opening may be formed by the processes discussed above with respect to FIGS. 1N-1O and 2Q-2R.

At operation 326, a conductive feature is formed in the contact opening. The conductive feature may be the conductive feature 144 or 244. The conductive feature may be formed by the processes discussed above with respect to FIGS. 1P-1Q and 2R-2S.

Various embodiments of the present disclosure provide an etch stop layer 132 having different etching selectivity with the dielectric fill 126 or provide a metal oxide layer 254 formed on the dielectric fill 226. The etch stop layer or the metal oxide layer serves as a barrier layer when performing the etch process for removing portions of the dielectric material 134 or 234. With the etch stop layer 132 or the metal oxide layer 254 disposed on the dielectric fill 126, the etch processes utilized to form the contact opening 140 or 240 do not substantially affect the dielectric fill 126 or 226. Thus, the risk of line-to-line leakage is reduced when EPE occurs.

An embodiment is an interconnect structure. The structure includes a dielectric layer, a first conductive feature, a conductive layer, a capping layer, a support layer and an etch stop layer. The first conductive feature is disposed in the dielectric layer. The conductive layer includes a first portion and a second portion. The first portion of the conductive layer is disposed over the first conductive feature, and the second portion of the conductive layer is disposed over the dielectric layer. The capping layer includes a first portion, a second portion opposing the first portion, and a third portion connecting the first portion and the second portion. The first portion of the capping layer is in contact with the first portion of the conductive layer, the second portion of the capping layer is in contact with the second portion of the conductive layer, and the third portion of the capping layer is in contact with the dielectric layer. The support layer is in contact with the first and second portions of the capping layer. An air gap is defined by the support layer, the first portion of the capping layer, the second portion of the capping layer, and the third portion of the capping layer. The etch stop layer is disposed over the second portion of the conductive layer, the second portion of the capping layer and the support layer.

Another embodiment is an interconnect structure. The structure includes a dielectric layer, a first conductive feature, a conductive layer, a capping layer, a support layer, a dielectric fill and a metal oxide layer. The first conductive feature is disposed in the dielectric layer. The conductive layer is disposed over the first conductive feature and the dielectric layer. The capping layer is embedded in the conductive layer. A sidewall of the capping layer is in contact with the conductive layer, and a bottom surface of the capping layer is in contact with the dielectric layer. The support layer is in contact with the capping layer. An air gap is defined by the support layer and the capping layer. The dielectric fill is disposed over the air gap and in contact with the support layer. The metal oxide layer is disposed over the dielectric fill, the support layer and the capping layer.

A further embodiment is a method for forming an interconnect structure. The method includes forming a conductive layer over a dielectric layer, forming one or more openings in the conductive layer to expose portions of dielectric surface of the dielectric layer and conductive surfaces of the conductive layer, wherein the one or more openings separates the conductive layer into one or more portions, forming a capping layer on exposed portions of the dielectric surface of the dielectric layer and conductive surface of the conductive layer, forming a sacrificial layer in the one or more openings, recessing the sacrificial layer, forming a support layer on the recessed sacrificial layer in each of the one or more openings, removing the sacrificial layer to form an air gap in each of the one or more openings, forming a dielectric fill on the support layer, recessing the conductive layer, forming an etch stop layer on the recessed conductive layer, the capping layer, the support layer and the dielectric fill, forming a dielectric material on the etch stop layer, forming a contact opening through the dielectric material and the etch stop layer to expose a top surface of a portion of the conductive layer, and forming a conductive feature in the contact opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming an interconnection structure, comprising:
    forming a conductive layer over a dielectric layer;
    forming one or more openings in the conductive layer to expose portions of dielectric surface of the dielectric layer and conductive surfaces of the conductive layer, wherein the one or more openings separates the conductive layer into one or more portions;
    forming a capping layer on exposed portions of the dielectric surface of the dielectric layer and conductive surface of the conductive layer;
    forming a sacrificial layer in the one or more openings;
    recessing the sacrificial layer so that at least a portion of the capping layer is exposed in the one or more openings;
    forming a support layer on the recessed sacrificial layer in each of the one or more openings;
    removing the sacrificial layer to form an air gap in each of the one or more openings;
    forming a dielectric fill on the support layer;
    recessing the conductive layer;
    forming an etch stop layer on the recessed conductive layer, the capping layer, the support layer and the dielectric fill;
    forming a dielectric material on the etch stop layer;
    forming a contact opening through the dielectric material and the etch stop layer to expose a top surface of a portion of the conductive layer; and
    forming a conductive feature in the contact opening.

2. The method of claim 1, wherein recessing the conductive layer, comprising:
    removing a hard mask layer of the conductive layer.

3. The method of claim 1, before recessing the conductive layer, further comprising:
    forming a metal oxide layer on the capping layer, the support layer and the dielectric fill.

4. The method of claim 3, wherein forming the etch stop layer on the recessed conductive layer, the capping layer, the support layer and the dielectric fill, comprises:
    forming the etch stop layer on the recessed conductive layer, the capping layer and the metal oxide layer.

5. The method of claim 1, wherein forming the dielectric fill, comprises:
    disposing the dielectric fill in the support layer; and
    performing a planarization operation to remove a portion of the capping layer, the support layer and the dielectric fill, wherein the capping layer, the support layer and the dielectric fill substantially have a co-planar top surface.

6. The method of claim 5, wherein a top surface of the recessed conductive layer is lower than the co-planar top surface of the capping layer, the support layer and the dielectric fill.

7. A method, comprising:
forming a dielectric layer having a first conductive feature disposed therein;
depositing a conductive layer over the dielectric layer and the first conductive feature;
patterning the conductive layer to form a first portion and a second portion of the conductive layer, wherein the first portion of the conductive layer is disposed over the first conductive feature, and the second portion of the conductive layer is disposed over the dielectric layer;
depositing a capping layer over the conductive layer and the dielectric layer, wherein the capping layer has a first portion, a second portion opposing the first portion, and a third portion connecting the first portion and the second portion, wherein the first portion of the capping layer is in contact with the first portion of the conductive layer, the second portion of the capping layer is in contact with the second portion of the conductive layer, and the third portion of the capping layer is in contact with the dielectric layer;
depositing a sacrificial layer over the capping layer to fill gaps around the first portion and the second portions of the conductive layer;
recessing the sacrificial layer to below a top surface of the conductive layer;
forming a support layer in contact with the first and second portions of the capping layer; and
depositing an etch stop layer over the second portion of the conductive layer, the second portion of the capping layer and the support layer.

8. The method of claim 7, further comprising removing the sacrificial layer to form an air gap, wherein the air gap is disposed between the first portion of the conductive layer and the second portion of the conductive layer.

9. The method of claim 8, further comprising:
depositing a dielectric fill over the air gap and in contact with the support layer.

10. The method of claim 9, wherein the etch stop layer is further disposed over the dielectric fill.

11. The method of claim 9, wherein a top surface of the first portion of the conductive layer is lower than a top surface of the dielectric fill, and a top surface of the second portion of the conductive layer is lower than a top surface of the dielectric fill.

12. The method of claim 7, further comprising:
depositing a dielectric material disposed over the second portion of the conductive layer, the second portion of the capping layer and the support layer; and
forming a second conductive feature in the dielectric material in contact with the first portion of the conductive layer and the first portion of the capping layer.

13. The method of claim 12, further comprising:
depositing a barrier layer disposed between the second conductive feature and the first portion of the conductive layer, and in contact with the second conductive feature, the first portion of the conductive layer and the first portion of the capping layer.

14. The method of claim 12, wherein the second conductive feature is further in contact with the support layer.

15. A method, comprising:
forming a dielectric layer having a first conductive feature disposed therein;
depositing a conductive layer over the first conductive feature and the dielectric layer;
forming one or more openings in the conductive layer to expose portions of dielectric surface of the dielectric layer and conductive surfaces of the conductive layer, wherein the one or more openings separates the conductive layer into one or more portions;
depositing a capping layer, wherein a sidewall of the capping layer is in contact with the conductive layer, and a bottom surface of the capping layer is in contact with the dielectric layer;
forming a sacrificial layer in lower portions of the one or more openings in the conductive layer, wherein a portion of the sidewall of the capping layer is exposed to the one or more openings;
depositing a support layer over the sacrificial layer, wherein the support layer is in contact with the sidewall of the capping layer;
removing the sacrificial layer to form an air gap is formed between the support layer and the capping layer;
depositing a dielectric fill over the air gap and in contact with the support layer;
depositing an etch stop layer over the conductive layer and the capping layer;
depositing a dielectric material disposed over the etch stop layer; and
forming a second conductive feature in the dielectric material, wherein the second conductive feature is in contact with the conductive layer and the capping layer.

16. The method of claim 15, wherein depositing the conductive layer comprises:
depositing a glue layer over the dielectric layer having a first conductive feature;
depositing a conductive material layer over the glue layer; and
depositing a hard mask layer over the conductive material layer.

17. The method of claim 16, further comprising:
selectively forming a blocking layer over the hard mask layer.

18. The method of claim 17, further comprising:
depositing a metal oxide layer over the dielectric fill, the support layer, and the capping layer.

19. The method of claim 18, further comprising removing the blocking layer and the hard mask layer to expose a top surface of the conductive material layer.

20. The method of claim 19, wherein the top surface of the conductive material layer is lower than a top surface of the metal oxide layer.

* * * * *